(12) United States Patent
van de Ven

(10) Patent No.: US 9,960,322 B2
(45) Date of Patent: May 1, 2018

(54) SOLID STATE LIGHTING DEVICES INCORPORATING NOTCH FILTERING MATERIALS

(71) Applicant: Cree, Inc., Durham, NC (US)

(72) Inventor: Antony Paul van de Ven, Hong Kong (CN)

(73) Assignee: CREE, INC., Durham, NC (US)

( * ) Notice: Subject to any disclaimer, the term of this patent is extended or adjusted under 35 U.S.C. 154(b) by 109 days.

(21) Appl. No.: 14/259,890

(22) Filed: Apr. 23, 2014

(65) Prior Publication Data

US 2015/0311402 A1    Oct. 29, 2015

(51) Int. Cl.

| | |
|---|---|
| *F21K 9/62* | (2016.01) |
| *F21K 9/64* | (2016.01) |
| *H01L 33/44* | (2010.01) |
| *H01L 33/56* | (2010.01) |
| *F21K 9/232* | (2016.01) |
| *F21K 9/233* | (2016.01) |
| *F21Y 115/10* | (2016.01) |

(52) U.S. Cl.
CPC ............... *H01L 33/44* (2013.01); *F21K 9/62* (2016.08); *F21K 9/64* (2016.08); *F21K 9/232* (2016.08); *F21K 9/233* (2016.08); *F21Y 2115/10* (2016.08); *H01L 33/56* (2013.01); *H01L 2224/48091* (2013.01); *H01L 2224/73265* (2013.01); *H01L 2924/181* (2013.01)

(58) Field of Classification Search
CPC ........... H01L 2224/48091; H01L 33/50; H01L 33/502; H01L 33/507; F21K 9/62; F21K 9/64

See application file for complete search history.

(56) References Cited

U.S. PATENT DOCUMENTS

| | | |
|---|---|---|
| 5,252,887 A | 10/1993 | Reisman |
| 6,600,175 B1 | 7/2003 | Baretz et al. |
| 6,639,360 B2 | 10/2003 | Roberts et al. |
| 6,717,732 B2 | 4/2004 | Meyr et al. |
| 6,737,681 B2 | 5/2004 | Koda |
| 6,744,194 B2 | 6/2004 | Fukasawa et al. |

(Continued)

FOREIGN PATENT DOCUMENTS

| | | |
|---|---|---|
| EP | 2489717 A1 | 8/2012 |
| JP | H05-290818 A | 11/1993 |

(Continued)

OTHER PUBLICATIONS

U.S. Appl. No. 13/017,407, filed Jan. 31, 2011.

(Continued)

*Primary Examiner* — Marcos D Pizarro
(74) *Attorney, Agent, or Firm* — Withrow & Terranova, P.L.L.C.; Vincent K. Gustafson

(57) ABSTRACT

Solid state lighting devices include one or more notch filtering materials arranged to filter light emissions to exhibit a spectral notch. At least one notch filtering material may be arranged in at least one coating deposited directly on an emitter chip or on a lumiphoric material that itself is coated or otherwise deposited on an emitter chip. A notch filtering material may be combined with a lumiphoric material. Emissions of a resulting lighting device may include a CRI Ra value of at least 80 and a GAI value in a range of from 75 to 100 or from 80 to 100.

23 Claims, 18 Drawing Sheets

(56) References Cited

U.S. PATENT DOCUMENTS

| | | | |
|---|---|---|---|
| 6,888,173 | B2 | 5/2005 | Ishii et al. |
| 6,940,101 | B2 | 9/2005 | Yano et al. |
| 7,063,996 | B2 | 6/2006 | Ishii et al. |
| 7,141,442 | B2 | 11/2006 | Sano |
| 7,168,833 | B2 | 1/2007 | Schottland et al. |
| 7,213,940 | B1 | 8/2007 | Van De Ven et al. |
| 7,658,866 | B2 | 2/2010 | Murazaki et al. |
| 7,937,865 | B2 | 5/2011 | Li et al. |
| 7,988,318 | B1 | 8/2011 | Smith et al. |
| 8,008,845 | B2 | 8/2011 | Van De Ven et al. |
| 8,258,722 | B2 | 9/2012 | Swoboda et al. |
| 8,575,836 | B2 | 11/2013 | van de Ven |
| 8,596,821 | B2 | 12/2013 | Brandes et al. |
| 2004/0201990 | A1 | 10/2004 | Meyer |
| 2004/0222726 | A1 | 11/2004 | Lamouri et al. |
| 2005/0275937 | A1 | 12/2005 | Wu et al. |
| 2006/0071589 | A1 | 4/2006 | Radkov |
| 2007/0240346 | A1 | 10/2007 | Li et al. |
| 2007/0241657 | A1 | 10/2007 | Radkov et al. |
| 2007/0267976 | A1 | 11/2007 | Bohler et al. |
| 2008/0013316 | A1 | 1/2008 | Chiang |
| 2008/0173884 | A1 | 7/2008 | Chitnis et al. |
| 2008/0179611 | A1 | 7/2008 | Chitnis et al. |
| 2008/0191609 | A1* | 8/2008 | Schmidt et al. ... C09K 11/7787 313/503 |
| 2008/0266884 | A1 | 10/2008 | Bogner et al. |
| 2009/0184616 | A1 | 7/2009 | Van De Ven et al. |
| 2009/0184618 | A1 | 7/2009 | Hakata et al. |
| 2009/0290348 | A1 | 11/2009 | Van Laanen et al. |
| 2010/0155763 | A1 | 6/2010 | Donofrio et al. |
| 2010/0213881 | A1 | 8/2010 | Imai |
| 2010/0244740 | A1 | 9/2010 | Alpert et al. |
| 2011/0180780 | A1 | 7/2011 | Yoo et al. |
| 2011/0227102 | A1 | 9/2011 | Hussell et al. |
| 2011/0299284 | A1 | 12/2011 | Van De Ven et al. |
| 2012/0155061 | A1 | 6/2012 | Manabe et al. |
| 2012/0040585 | A1 | 9/2012 | Huang |
| 2012/0306355 | A1 | 12/2012 | Seibel, II |
| 2013/0170199 | A1 | 7/2013 | Athalye et al. |
| 2013/0271991 | A1 | 10/2013 | Hussell et al. |

FOREIGN PATENT DOCUMENTS

| | | |
|---|---|---|
| JP | 2004080046 A | 3/2004 |
| JP | 2007173557 A | 7/2007 |
| WO | 2012031533 A1 | 3/2012 |

OTHER PUBLICATIONS

U.S. Appl. No. 13/017,502, filed Jan. 31, 2011.
U.S. Appl. No. 13/235,103, filed Sep. 16, 2011.
U.S. Appl. No. 13/235,127, filed Sep. 16, 2011.
U.S. Appl. No. 14/259,943, filed Apr. 23, 2014.
U.S. Appl. No. 13/341,337, filed Dec. 30, 2011.
Author Unknown, "69204—LED11DA19RVL/TP: GE LED A19 Technical Specifications," GE Lighting Product Catalog for consumers, retrieved Jan. 20, 2015 from http://genet.gelighting.com/LightProducts/Dispatcher?REQUEST=CONSUMERSPECPAGE &PRODUCTCODE=69204&TABID=2&BreadCrumbValues= &ModelSelectionFilter=, 1 page.
Author Unknown, "CALiPER Retail Lamps Study 3," Solid-State Lighting Program, Feb. 2014, Pacific Northwest National Laboratory, U.S. Department of Energy, 48 pages.
Author Unknown, "Interference Filters & Special Filters," Description—2013, SCHOTT North America, Inc., Retrieved on Apr. 6, 2015 from http://www.schott.com/advanced_optics/english/download/schott_interference_filters_descript_2013_eng.pdf, 36 pages.
Cho, Y., et al., "Optical properties of neodymium-containing polymethylmethacrylate films for the organic light emitting diode color filter," Applied Physics Leite rs, vol. 89, 2006, pp. 051102-1-051102-3.
Cree, Inc., "Cree XLamp MT-G EasyWhite LEDs," Product Family Data Sheet/Binning and Labeling Document, 2011, pp. 1-16.
Cree, Inc., "Cree XLamp XP-G LEDs," Product Family Data Sheet, 2009-2011, pp. 1-12.
Cree, Inc., "Cree XLamp XT-E HVW LEDs," Product Family Data Sheet, 2011, pp. 1-9.
Cree, Inc., "Get High Efficacy and Low System Cost for the Smallest LED Systems with Cree XLamp High Voltage LEDs," 2011, 2 pages.
Lee, D.K., et al., "Optical properties of inorganic $(SiO_2)_{1-x}(Nd_2O_3)_x$ alloy films for the color filter of plasma display panel," Applied Physics Letters, vol. 80, No. 6, Feb. 11, 2002, pp. 983-985.
Author Unknown, "SkyGlow & UltraBlock Light-Pollution Filters," Orion Telescopes & Binoculars, 1 page.
Author Unknown, "OSLON Black Series, Lead(Pb) Free Product—RoHS Compliant, LCW H9GP," OSRAM Opto Semiconductors, Aug. 25, 2011, 23 pages.
Author Unknown, "Products and Sales," Rugate Technologies, Inc., http://www.rugate.com/products.html, accessed Dec. 9, 2011, 1 page.
Sohn, S.H., et al., "Optical properties of the neodymium-containing transparent dielectrics for plasma display panel," Applied Physics Letters, vol. 81, No. 17, Oct. 21, 2002, pp. 3179-3181.
International Search Report and Written Opinion for PCT/US2012/070269, dated Mar. 5, 2013, 10 pages.
International Preliminary Report on Patentability for PCT/US2012/070269, dated Jul. 1, 2014, 5 pages.
Non-Final Office Action for U.S. Appl. No. 13/341,337, dated Feb. 25, 2014, 17 pages.
Final Office Action for U.S. Appl. No. 13/341,337, dated Jun. 25, 2014, 22 pages.
Advisory Action for U.S. Appl. No. 13/341,337, dated Aug. 1, 2014, 3 pages.
Non-Final Office Action for U.S. Appl. No. 13/341,337, dated Oct. 22, 2014, 26 pages.
Final Office Action for U.S. Appl. No. 13/341,337, dated Feb. 12, 2015, 29 pages.
Author Unknown, "69204—LED11DA19RVL/TP: GE LED A19 Features & Photos," GE Lighting Product Catalog for consumers, retrieved Jan. 20, 2015 from http://genet.gelighting.com/LightProducts/Dispatcher?REQUEST=CONSUMERSPECPAGE &PRODUCTCODE=69204, 1 page.
Kim, Ilku et al., "Wide Color Gamut Backlight from Three-band White LED," Journal of the Optical Society of Korea, vol. II, No. 2, Jun. 2007, pp. 67-70.
Rea, Mark S., "Value Metrics for Better Lighting," vol. PM228, 2013, SPIE Press, pp. 36-43, 52-63.
Smet, Kevin et al., "Correlation between color quality metric predictions and visual appreciation of light sources," Optics Express, vol. 19, No. 9, Apr. 2011, 16 pages.
Advisory Action and Interview Summary for U.S. Appl. No. 13/341,337, dated Apr. 22, 2014, 10 pages.
Non-Final Office Action and Examiner-Initiated Interview Summary for U.S. Appl. No. 13/341,337, dated Jul. 16, 2015, 21 pages.
Final Office Action for U.S. Appl. No. 13/341,337, dated Nov. 2, 2015, 22 pages.
Clapp, Terry V., 'Silicone Solutions for LED Lighting'. Presentation [online]. Dow Corning Corporation, 2010 [retrieved on Mar. 11, 2016]. Retrieved from the Internet: <URL: www.photonics21.org/uploads/ffUKqXMyzv.pdf>. 39 pages.
Notice of Allowance, Examiner-Initiated Interview Summary and AFCP 2.0 Decision for U.S. Appl. No. 13/341,337, dated Jan. 22, 2016, 12 pages.

* cited by examiner

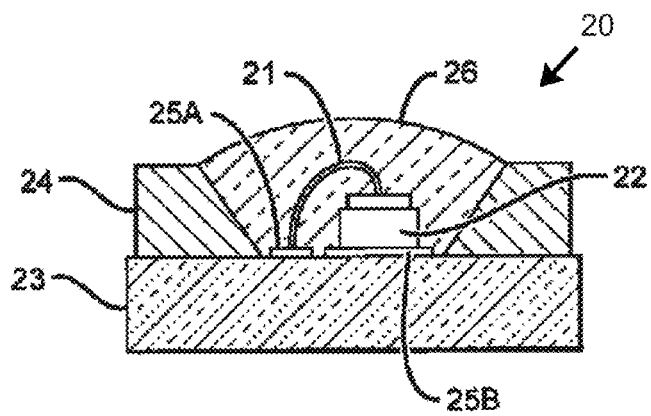
FIG._1 (RELATED ART)
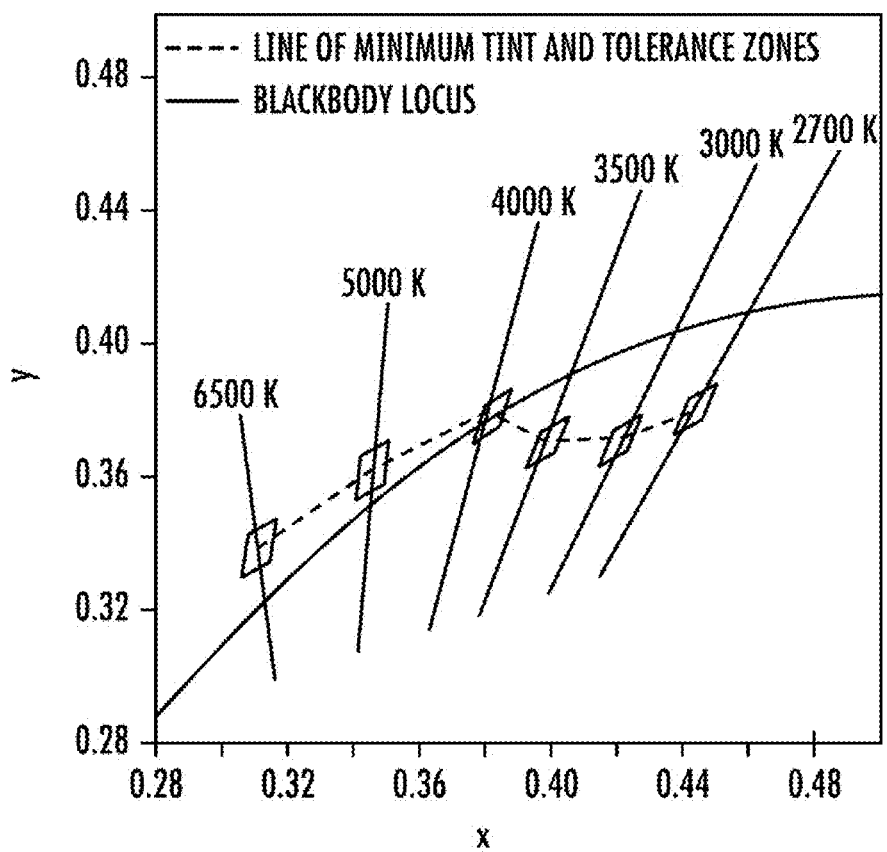
FIG._2 (RELATED ART)

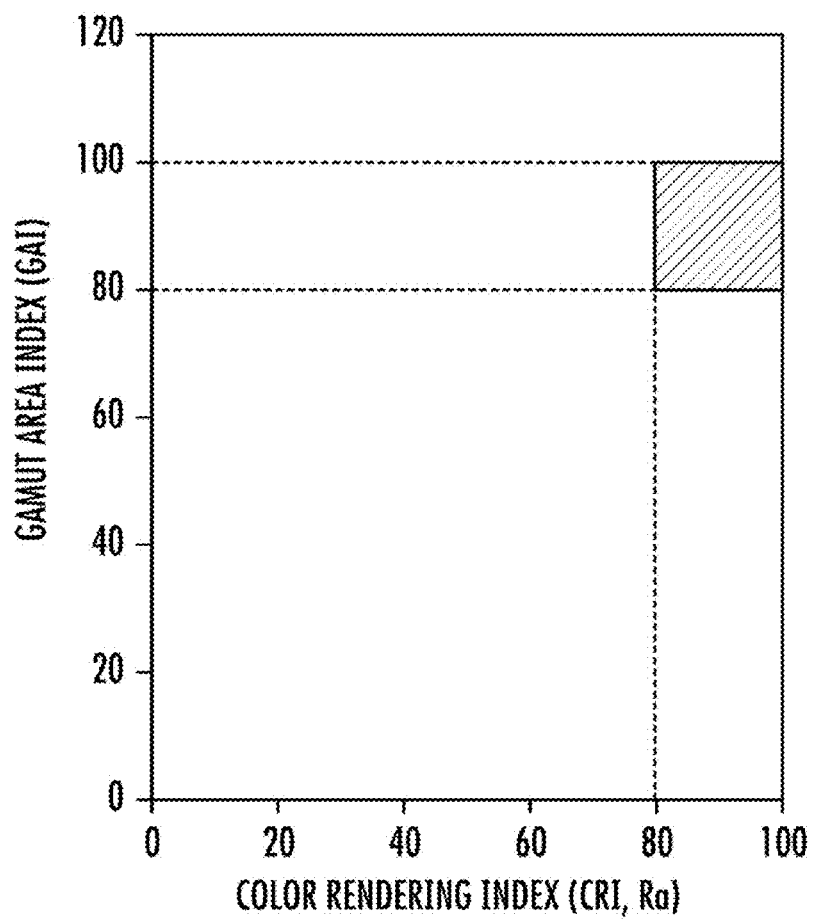
FIG._3
(RELATED ART)

| #    | Light source              | CCT   | CRI | GAI | x      | y      | System lm/W | S/P   |
|------|---------------------------|-------|-----|-----|--------|--------|-------------|-------|
| 1.1  | HPS, 400 W                | 2050  | 15  | 14  | 0.5208 | 0.4134 | 96          | 0.66  |
| 1.2  | Pulse-start MH, 320 W     | 4159  | 58  | 51  | 0.3799 | 0.3984 | 72          | 1.61  |
| 1.3  | Mercury vapor, 400 W clear| 5891  | 15  | 25  | 0.3191 | 0.4317 | 42          | 1.33  |
| 1.4  | LPS, 180 W                | 1785  | −42 | 0   | 0.5681 | 0.4285 | 144         | 0.25  |
| 1.5  | Xenon, 1000 W             | 5853  | 97  | 91  | 0.3245 | 0.3439 | 26          | 2.37  |
| 1.6  | White LED, 6500 K         | 6528  | 72  | 84  | 0.3116 | 0.3340 | 80          | 2.06  |
| 2.1  | A lamp, 60 W (frosted)    | 2764  | 100 | 49  | 0.4555 | 0.4109 | 14          | 1.36  |
| 2.2  | A lamp, 60 W (neodymium doped) | 2789 | 78 | 65 | 0.4460 | 0.3962 | 11          | 1.52  |
| 2.3  | Halogen, 3277 K           | 3279  | 100 | 65  | 0.4184 | 0.3969 | 20          | 1.60  |
| 2.4  | CFL, 15 W                 | 2653  | 83  | 48  | 0.4652 | 0.4141 | 61          | 1.11  |
| 2.5  | Fluorescent, F34T12 cool white | 4022 | 62 | 58 | 0.3833 | 0.3905 | 63          | 1.48  |
| 2.6  | Fluorescent, FO32T8RE835  | 3308  | 86  | 69  | 0.4157 | 0.3939 | 86          | 1.44  |
| 2.7  | Fluorescent, F40T12 daylight | 4861 | 90 | 84 | 0.3502 | 0.3645 | 50          | 1.97  |
| 2.8  | Ceramic MH, 100 W         | 4075  | 93  | 80  | 0.3773 | 0.3749 | 66          | 1.79  |
| 2.9  | White LED, 2700 K         | 2706  | 84  | 49  | 0.4575 | 0.4072 | 65          | 1.21  |
| 2.10 | White LED, 6500 K         | 6528  | 72  | 84  | 0.3116 | 0.3340 | 80          | 2.06  |
| 3.1  | Blue LED, 470-nm peak     | N/A   | N/A | 4   | 0.1247 | 0.0929 | 10          | 12.79 |
| 3.2  | Fluorescent, F20T12 aquarium lamp | 13408 | 83 | 103 | 0.2676 | 0.2719 | 51       | 2.76  |
| 3.3  | Fluorescent food-display lamp | 3195 | 61 | 128 | 0.3869 | 0.3153 | 36          | 1.97  |

FIG._4A (RELATED ART)

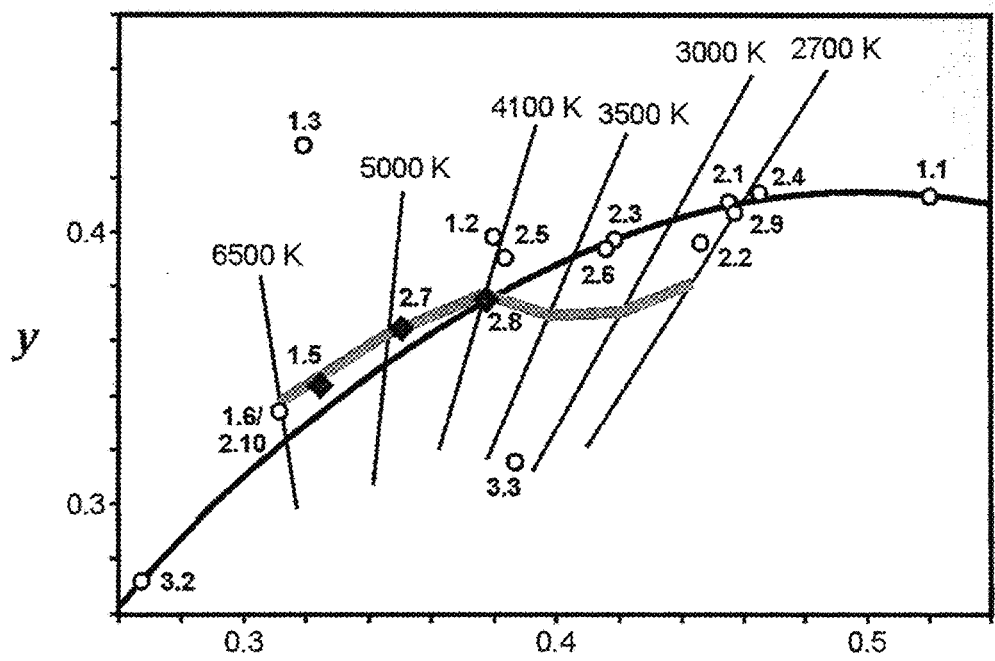

FIG._4B (RELATED ART)

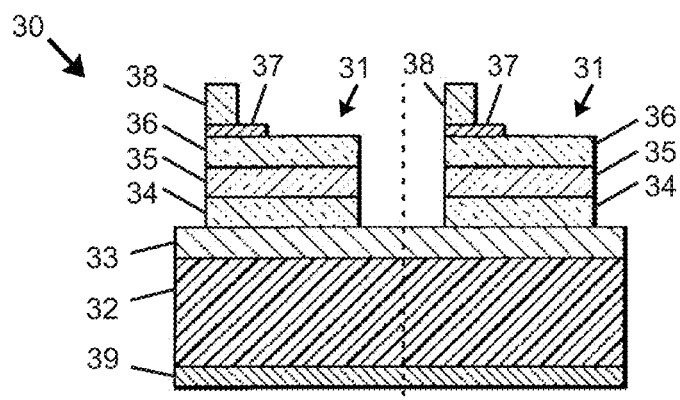
FIG._5A
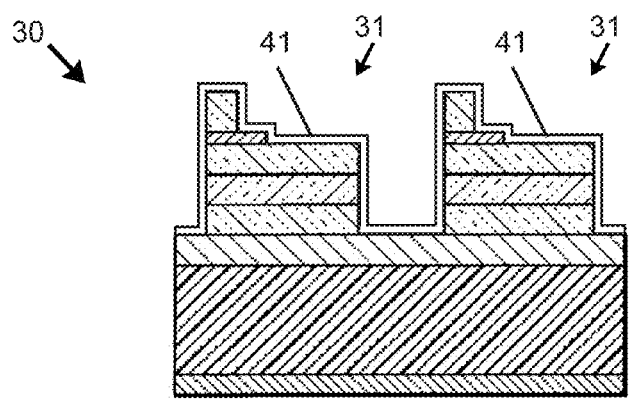
FIG._5B
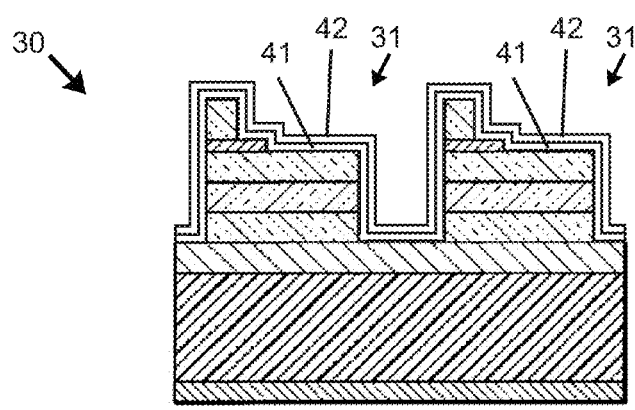
FIG._5C

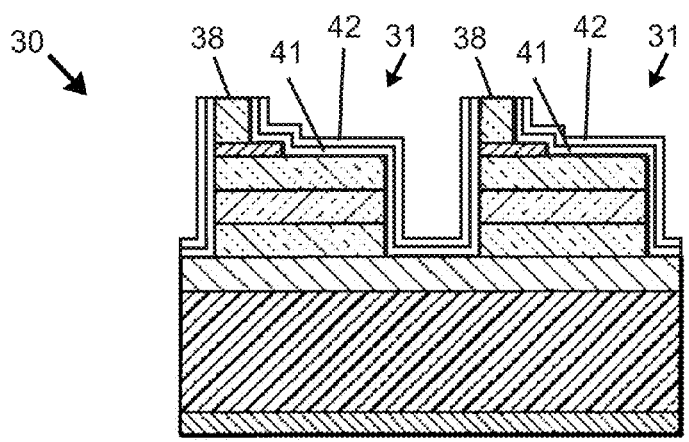
FIG._5D
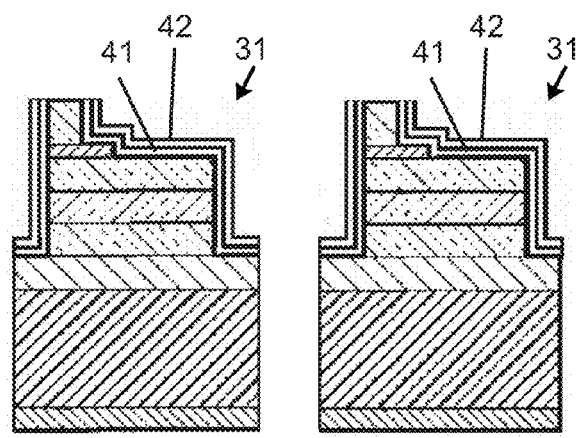
FIG._5E

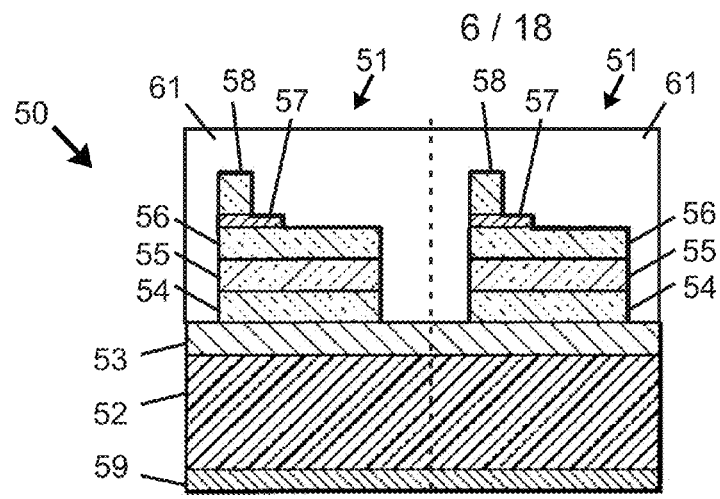
FIG._6A
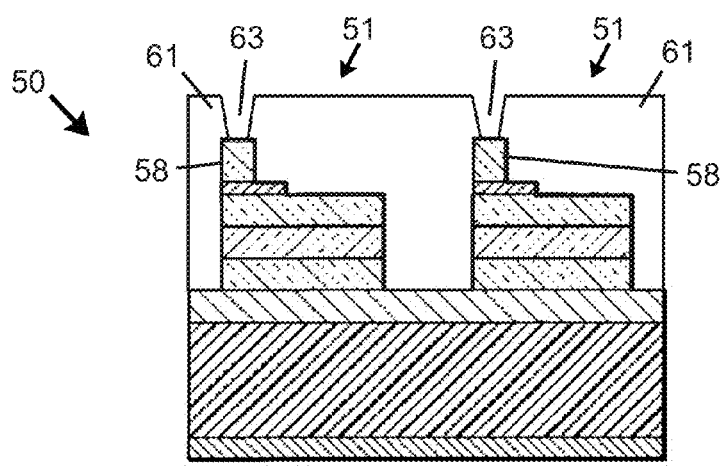
FIG._6B
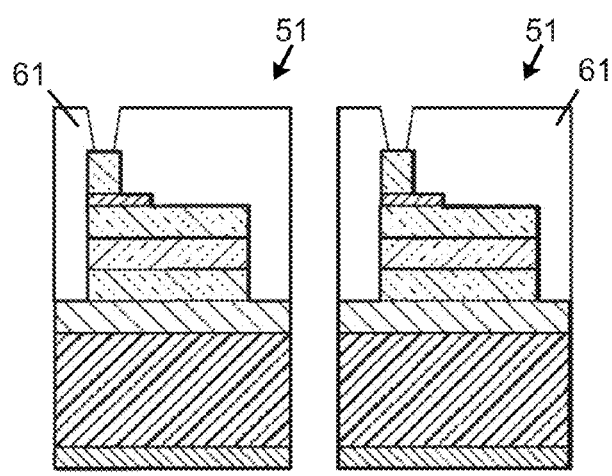
FIG._6C

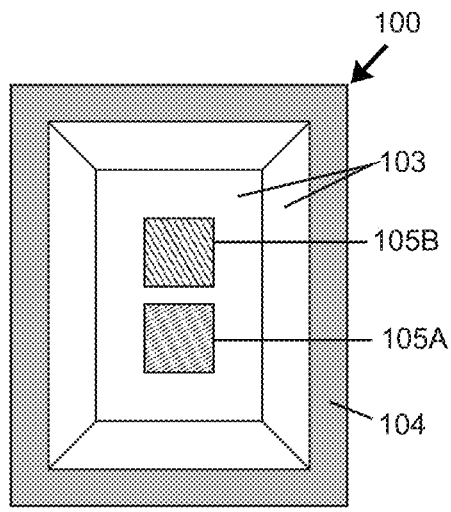
FIG. _7A
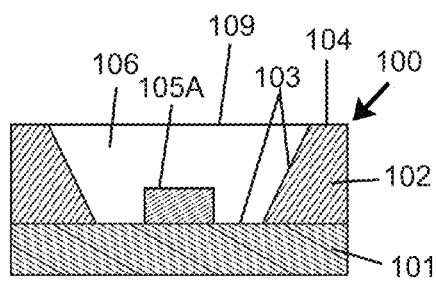
FIG. _7B
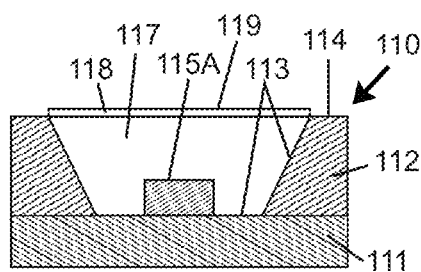
FIG. _7C
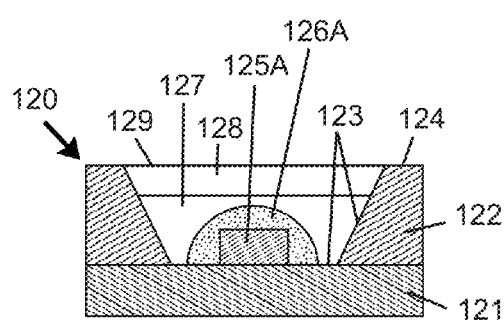
FIG. _7D
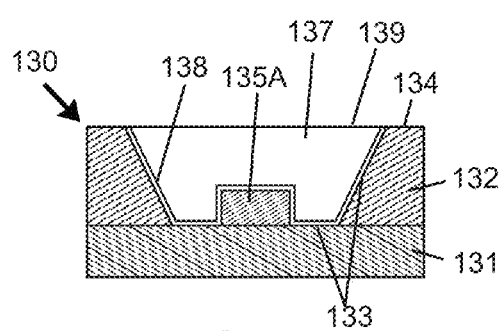
FIG. _7E
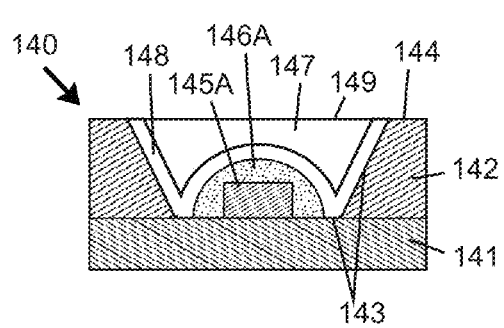
FIG. _7F

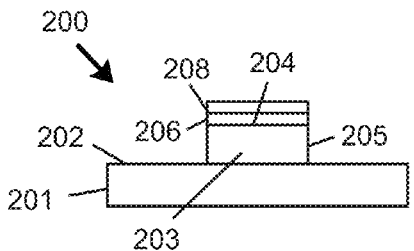
FIG._8A
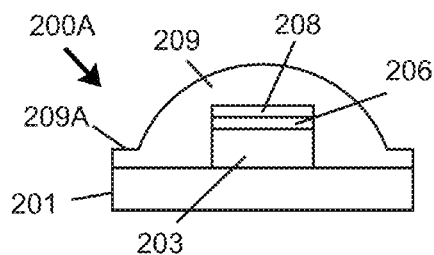
FIG._8B
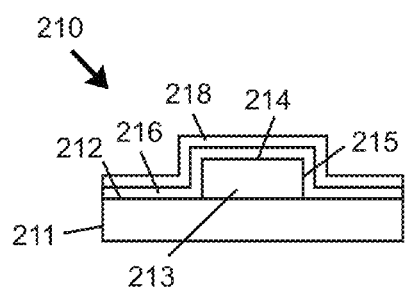
FIG._8C
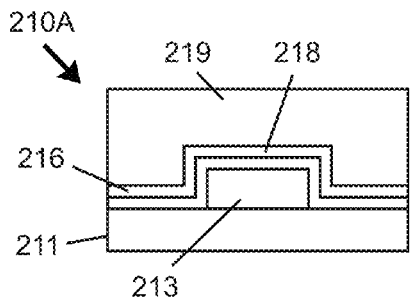
FIG._8D
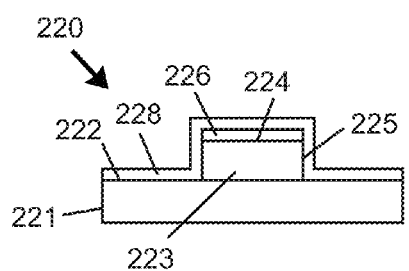
FIG._8E
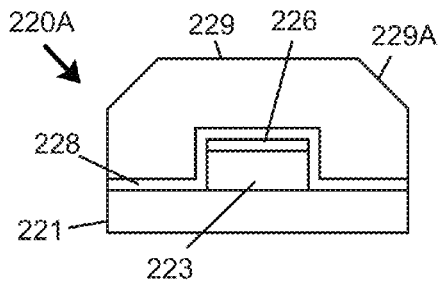
FIG._8F

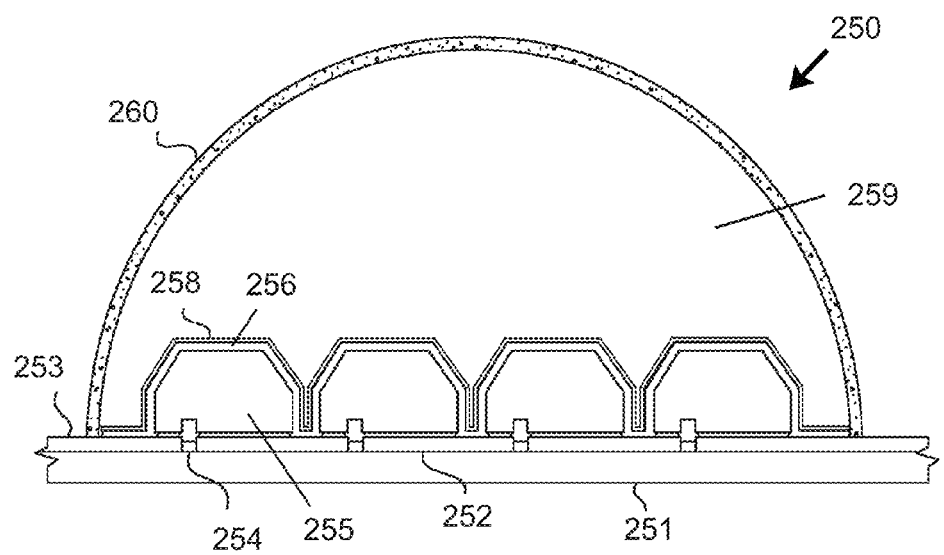
FIG._9
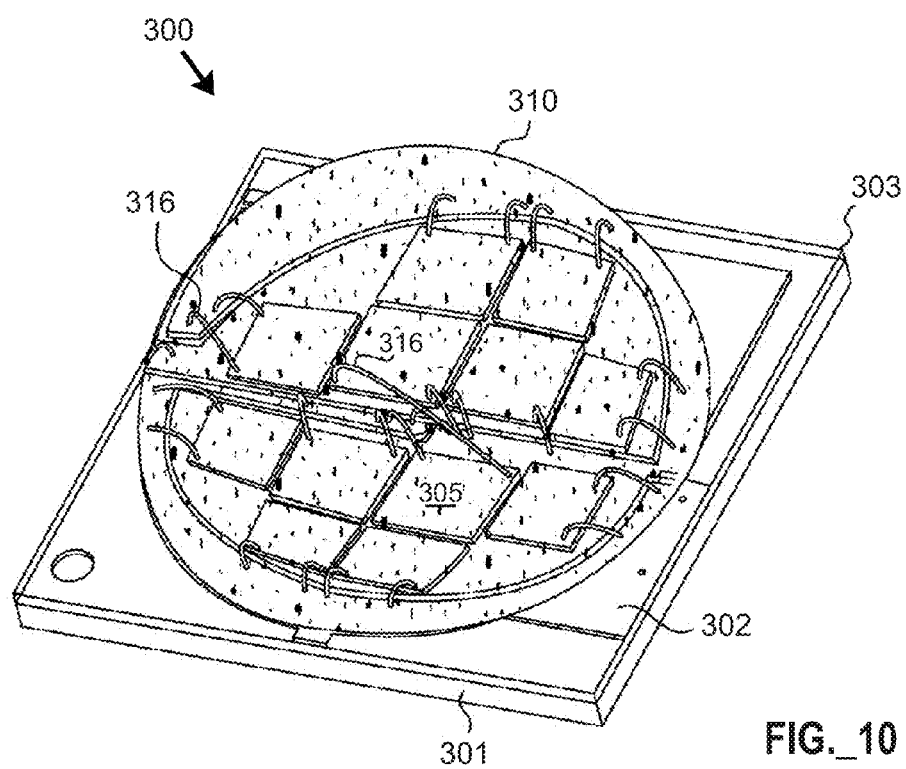
FIG._10

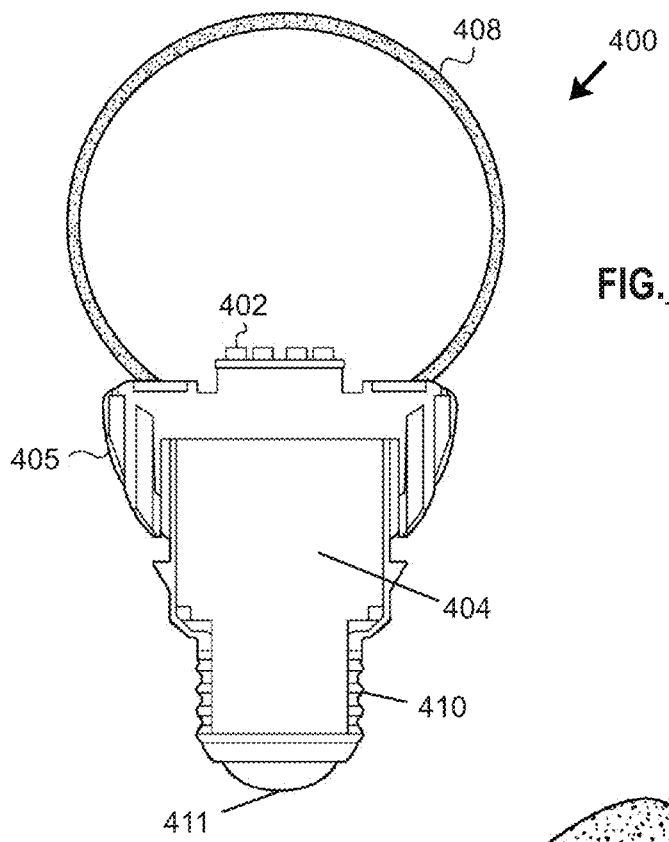
FIG._11
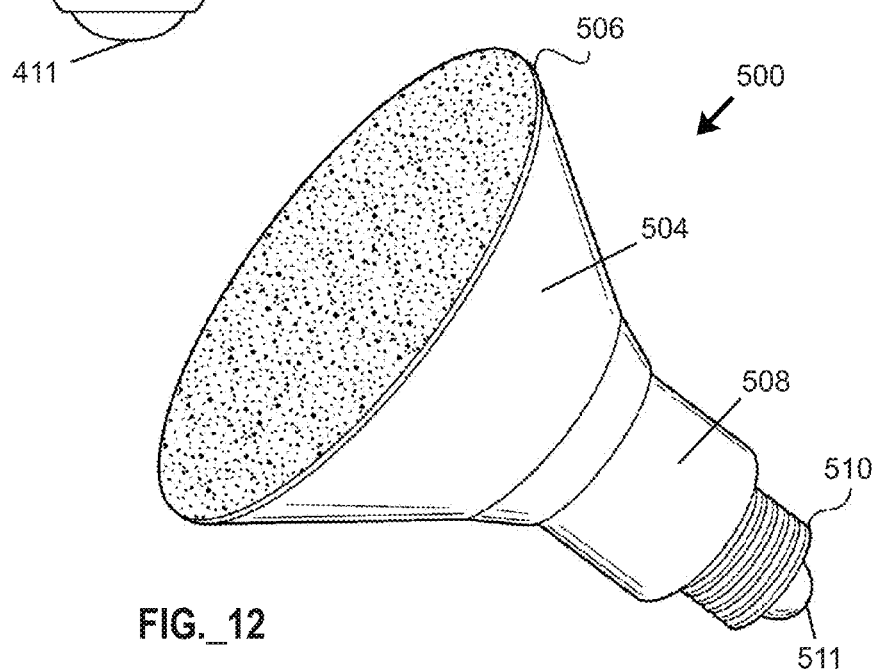
FIG._12

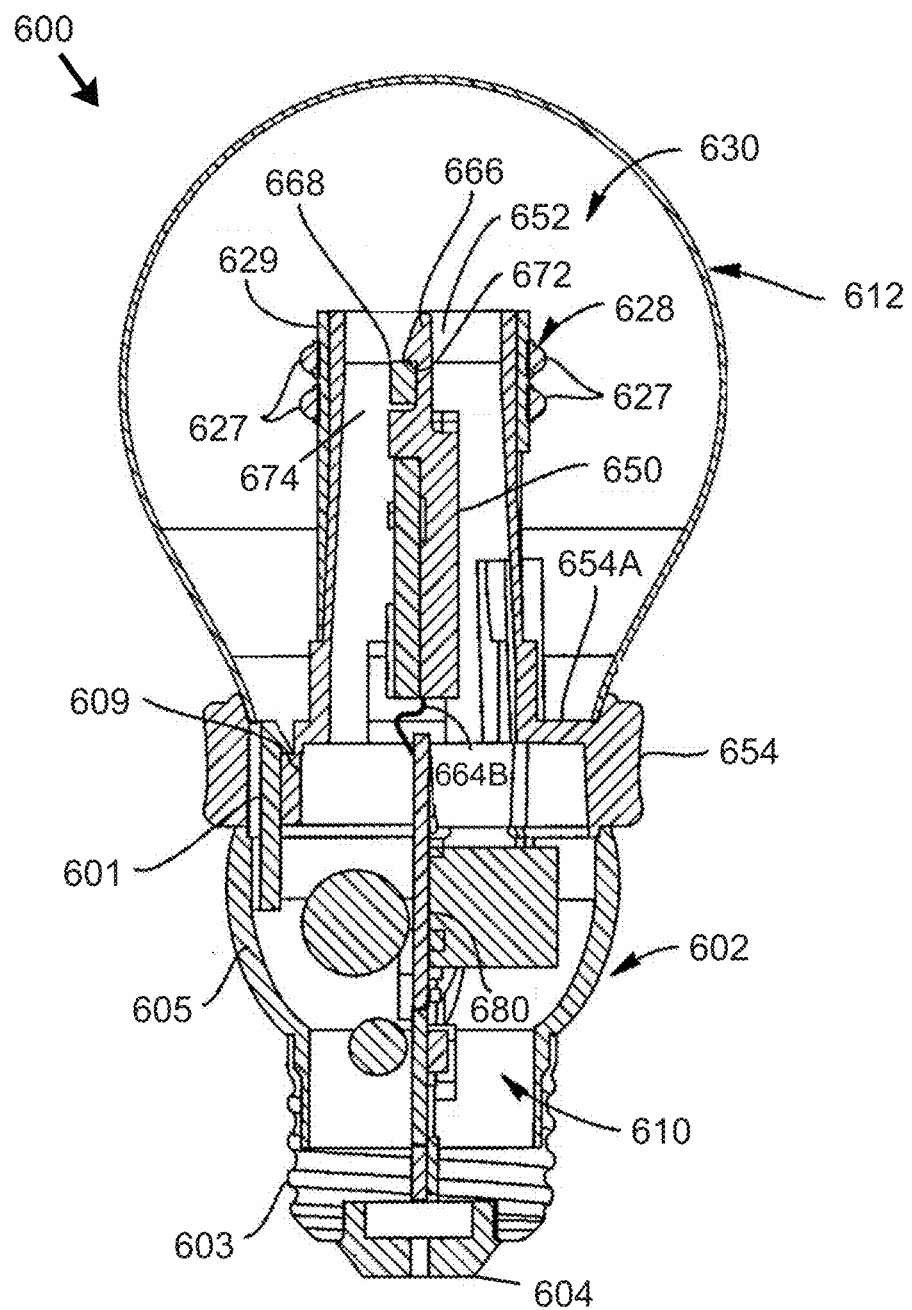
FIG._13

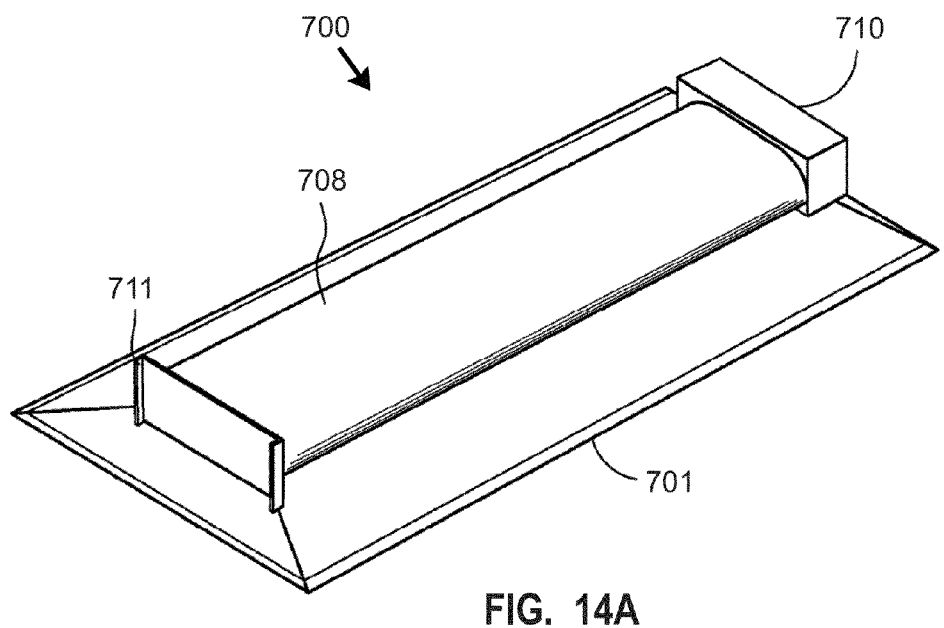
FIG._14A
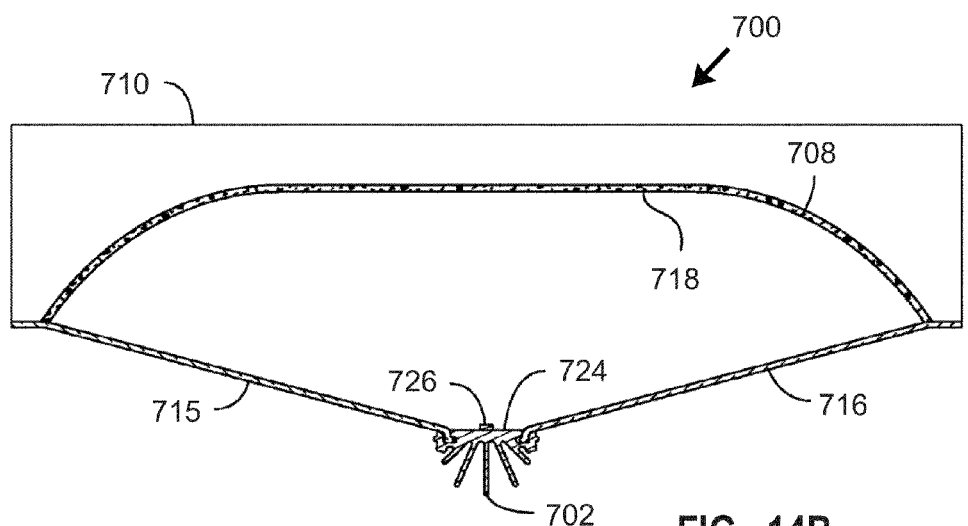
FIG._14B

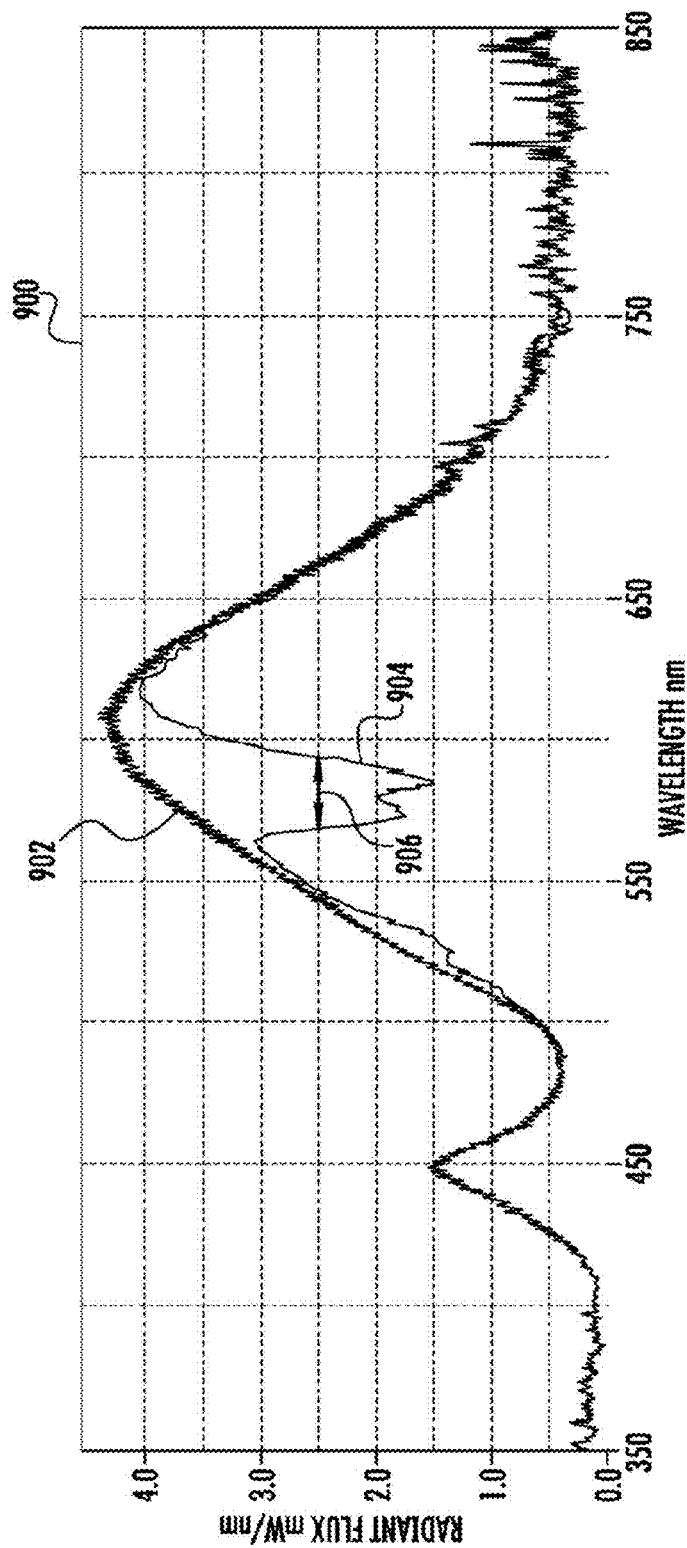
FIG._15

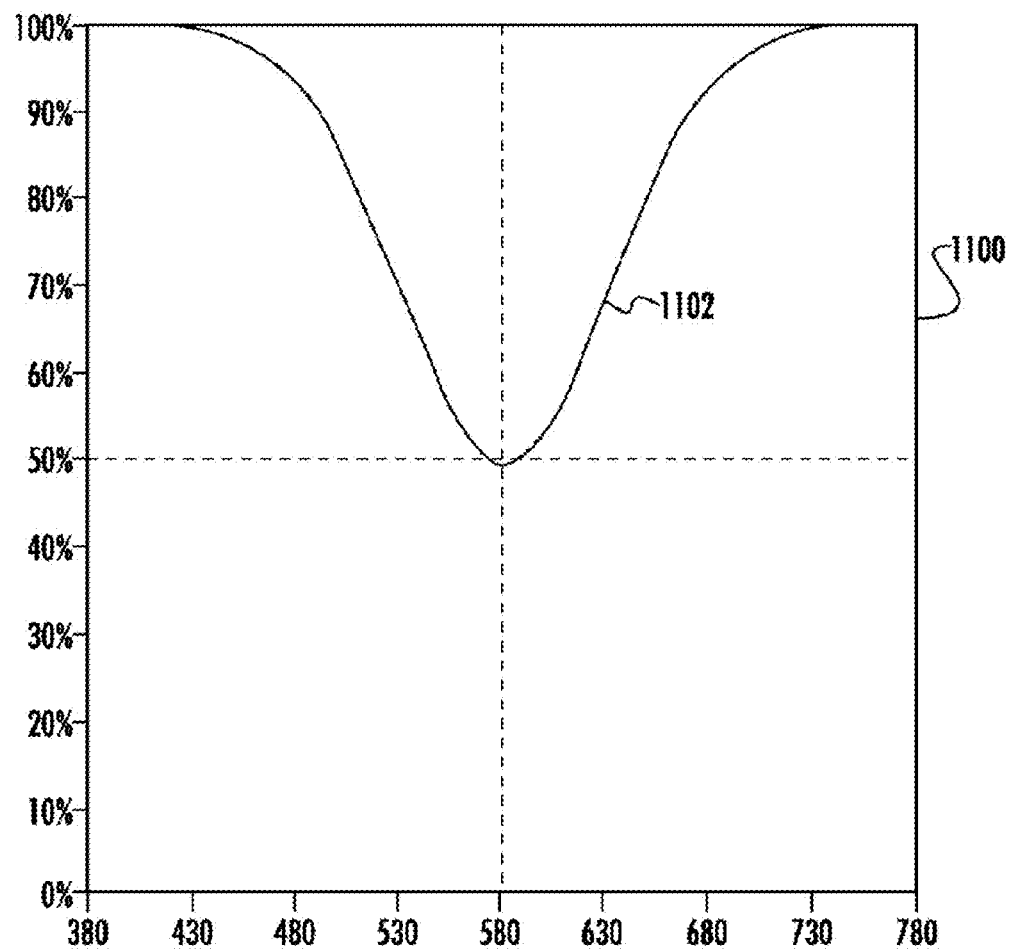
FIG._16

|  | Incandescent | Unfiltered BS(Y+R) | High CRI Nd filtered BS(Y+R) | Neo WBL Nd filtered BS(Y+R) |
|---|---|---|---|---|
| GAI | 49% | 49% | 63% | 78% |
| CRI Ra | 100 | 81 | 92 | 80 |
| R9 | 100 | 17 | 82 | 58 |
| LEP | 149 | 319 | 294 | 270 |
| S/P ratio | 1.35 | 1.14 | 1.25 | 1.35 |
| LPW | - | 106 | 86 | 70 |
| Filter lumen loss | 0% | 0% | 19% | 34% |
| Du'v' BBL | 0.000 | 0.000 | 0.006 | 0.014 |
| Nd density (3.2 mm ref.) | 0.00 | 0.00 | 0.50 | 1.20 |

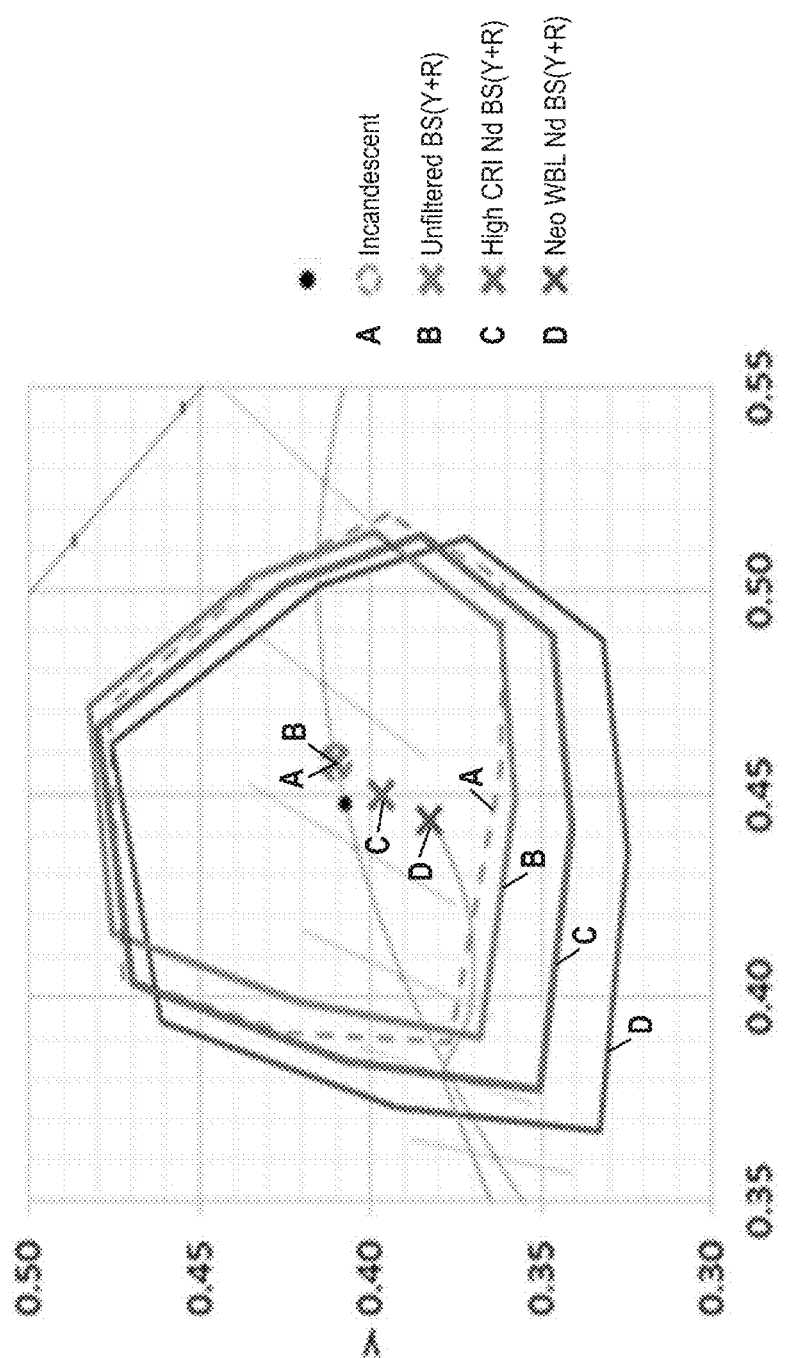
FIG._19

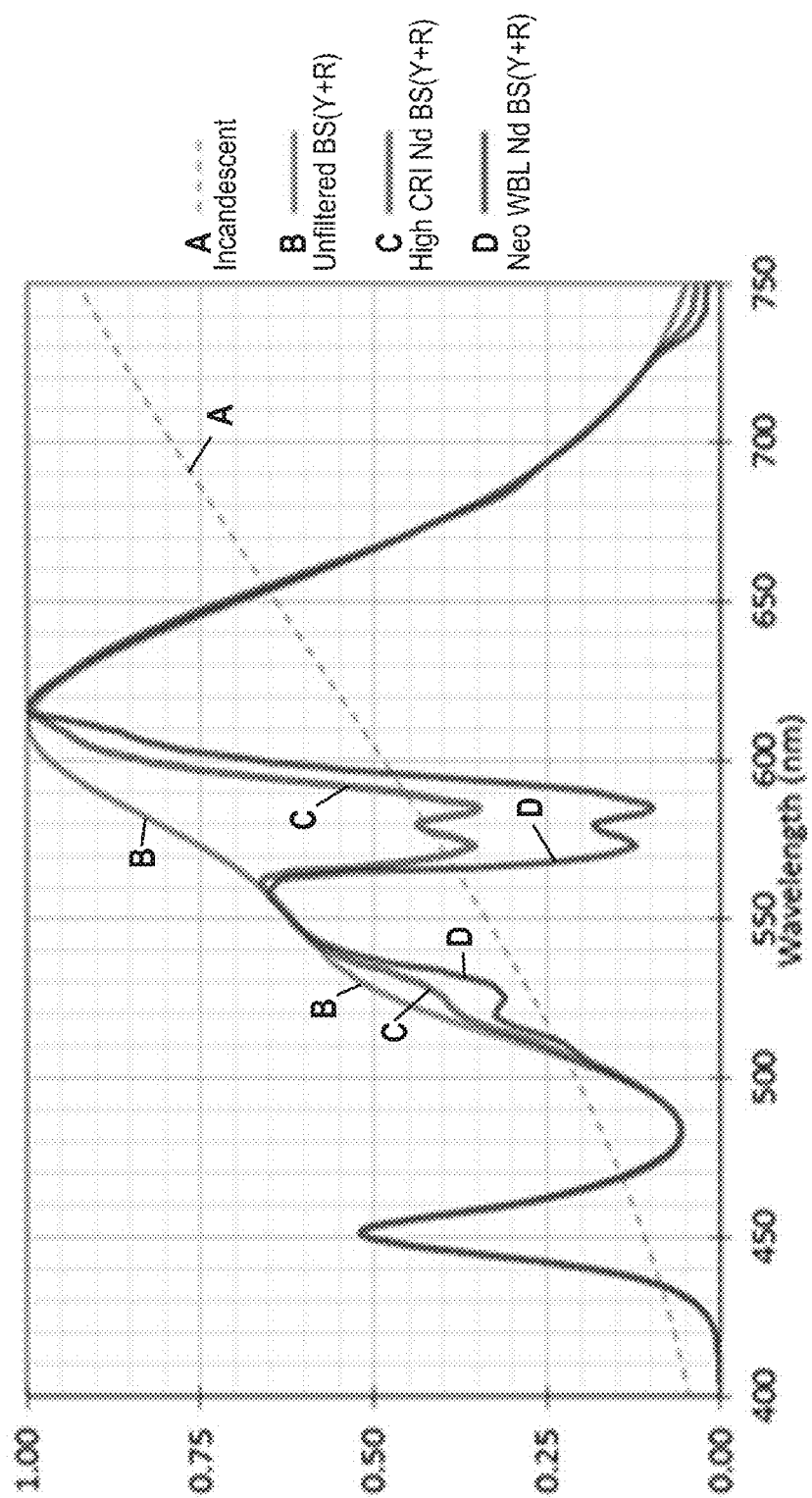
FIG._20

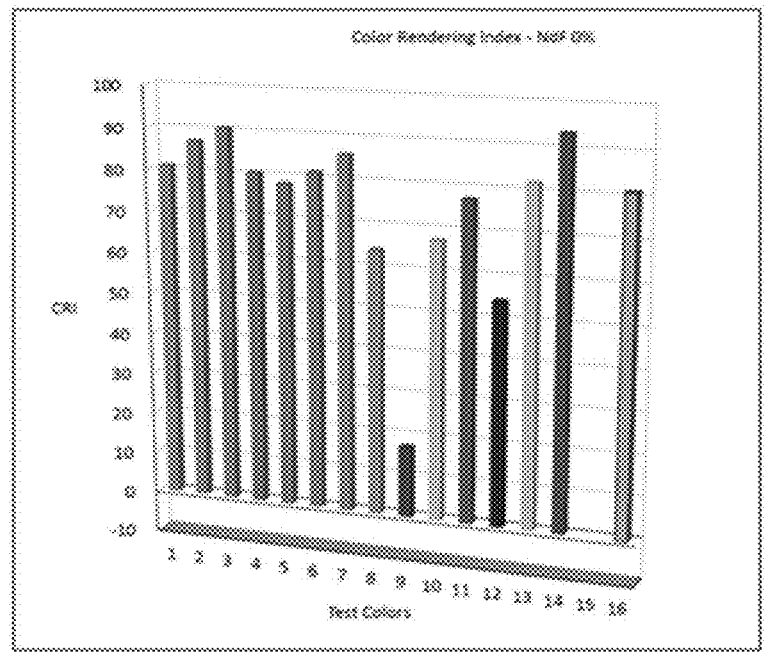
FIG._21A
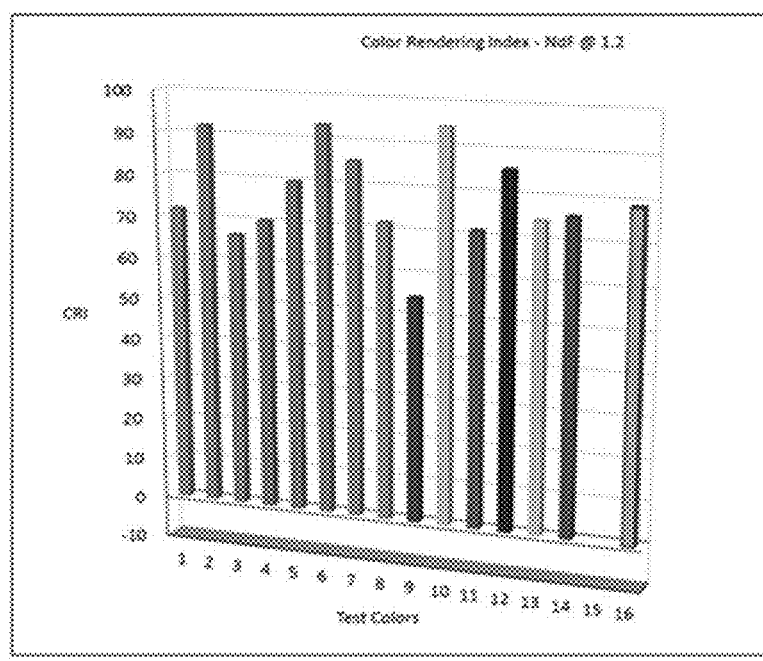
FIG._21B

SOLID STATE LIGHTING DEVICES INCORPORATING NOTCH FILTERING MATERIALS

TECHNICAL FIELD

Subject matter herein relates to solid state lighting devices, including devices with lumiphors arranged to be stimulated by electrically activated solid light emitters, and relates to associated methods of making and using such devices.

BACKGROUND

Solid state emitters such as LEDs or lasers may be used to provide white light (e.g., perceived as being white or near-white), and have been investigated as potential replacements for white incandescent lamps. Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or, alternatively, by combined emissions of a blue light emitting diode ("LED") and a lumiphor such as a yellow phosphor (e.g., YAG:Ce or Ce:YAG). In the latter case, a portion of the blue LED emissions pass through the phosphor, while another portion of the blue emissions is downconverted to yellow, and the blue and yellow light in combination are perceived as white. White light may also be produced by stimulating phosphors or dyes of multiple colors with a violet or UV LED source.

It is known to enclose an LED chip in a package to provide environmental and/or mechanical protection, color selection, light focusing and other functions. A LED package also includes electrical leads, contacts, and/or traces for electrically connecting the LED package to an external circuit. A conventional LED package 20 is illustrated in FIG. 1, including one or more LED chips 22 mounted over a carrier such as a printed circuit board (PCB) carrier, substrate or submount 23, which may include ceramic material. The package 20 may include one or more LED chips 22 of any suitable spectral output (e.g., ultraviolet, blue, green, red, white (e.g., blue LED chip arranged to stimulate emissions of phosphor material) and/or other colors). A reflector 24 may be mounted on the submount 23 (e.g., with solder or epoxy) to surround the LED chip(s) 22, reflect light emitted by the LED chips 22 away from the package 20, and also provide mechanical protection to the LED chips 22. One or more wirebond connections 21 may be made between ohmic contacts on the LED chips 22 and electrical traces 25A, 25B on the submount 23. The LED chips 22 are covered with a transparent encapsulant 26, which may provide environmental and mechanical protection to the chips while also acting as a lens.

Emissions of a blue LED in combination with a yellow or green lumiphoric material may be near-white in character and referred to as "blue-shifted yellow" ("BSY") light or "blue-shifted green" ("BSG") light. Addition of red spectral output from a red-emitting LED (to yield a "BSY+R" device) or from a red lumiphoric material (to yield a "BS(Y+R)" device) may be used to increase the warmth of the aggregated light output and better approximate light produced by incandescent lamps.

Quality artificial lighting generally attempts to emulate the characteristics of natural light. Natural light sources include daylight with a relatively high color temperature (e.g., ~5000K) and incandescent lamps with a lower color temperature (e.g., ~2800K).

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. The general or average color rendering index CRI Ra is a modified average utilizing the first eight indices, all of which have low to moderate chromatic saturation. CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight is the "best" light for emphasizing and distinguishing color. The ability of human vision to differentiate color is different under correlated color temperature conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low correlated color temperature (CCT) sources (e.g., incandescent emitters) have a gamut area index of approximately 50% (i.e., about half the gamut area of the EES source). Sources with higher CCT values have a larger GAI. For example, a very bluish light with a CCT of 10000K may have a GAI of 140%.

The reference spectra used in color rendering index calculations were chosen as ideal illumination sources defined in terms of their color temperature. As a heated object becomes incandescent, it first glows reddish, then yellowish, then white, and finally bluish. Thus, apparent colors of incandescing materials are directly related to their actual temperature (in Kelvin (K)). Practical materials that incandesce are said to have correlated color temperature (CCT) values that are directly related to color temperatures of blackbody sources. CCT is intended to characterize the apparent "tint" of the illumination (e.g., warm or cool) produced by an electric light source. Certain implicit assumptions are embedded in this CCT designation—such as the assumption that chromaticities along the line of blackbody radiation are perceived as 'white', and that a CCT designation for a manufactured light source implies consistency in chromaticities of all sources having that designation. Recent research suggests, however, that most sources with chromaticities along the line of blackbody radiation do not appear "white"; rather, such sources provide illumination with discernible tint. An empirically established line of minimum tint in CIE 1931 (x,y) chromaticity space for CCTs between 2700K and 6500K is shown in FIG. 2. Researchers have determined that a majority of people prefer sources of illumination on this "white body line" (i.e., line of minimum tint) more than those of the same CCT line of blackbody radiation. (See, e.g., Rea, M. S. and Freyssinier, J. P.: "White lighting for residential applications," Light Res. Tech., 45(3), pp. 331-344 (2013).) As shown in FIG. 2, at CCT values below about 4000K, the "white body line" (WBL) is below the blackbody curve, whereas at higher CCT values, the WBL is above the blackbody curve.

Rea and Freyssinier have proposed that lighting could be generally improved by ensuring that its CRI Ra value is at least 80 while its GAI is in a range of from 80 to 100 (i.e., 80% and 100% of an equal energy spectrum). FIG. 3 provides a plot of GAI values along the y-axis and CRI Ra values along the x-axis, with the shaded region at upper right representing a preferred combination of CRI Ra≥80 and 80≤GAI≤100. Rea and Freyssinier have proposed to designate a light source embodying CRI Ra and GAI values in the foregoing ranges as a "Class A" light source.

Characteristics including CCT, CRI Ra, GAI, CIE 1931 (x,y) coordinates, luminous efficacy (lm/W), and scotopic/photopic (S/P) ratios for eighteen different light sources are tabulated in FIG. 4A, and chromaticities for selected sources of the foregoing eighteen light sources are plotted in FIG. 4B together with the blackbody curve and the WBL (line of minimum tint). (Source: "Value Metrics for Better Lighting," Rea, Mark S., et al., 2013, pp. 54 & 63, SPIE Press (Bellingham, Wash., US), ISBN 978-0-8194-9322-4.) Only three sources (i.e., Xenon lamp (#1.5), fluorescent F40T12 daylight lamp (#2.7), and ceramic metal halide (#2.8)) meet the Class A color designation. Although numerous solid state light sources are characterized in FIG. 4A (i.e., white LED 6500K (#1.6 and #2.10), white LED 2700K (#2.9), and blue LED 470 nm peak (#3.1)), none of these solid state light sources meet the Class A color designation. It is noted that a neodymium doped 60 W (incandescent) A-lamp (#2.2) having a CRI Ra of 78 and GAI of 65 also failed to meet the Class A color designation.

As indicated in FIG. 3A, the ability of artificial lights to accurately illuminate color objects varies enormously by type. Solid state emitters such as LEDs in combination with lumiphors create white light by mixing relatively narrow wavelength bands together with spectral gaps between peaks of LEDs and/or lumiphors. The resulting light may be under-saturated with certain colors of the spectrum or over-saturated with certain colors. One way to alleviate oversaturation with respect to certain portions of the visible spectrum and thereby improve CRI includes notch filtering of LED lighting systems with an optical element (e.g., incorporating a rare earth compound such as neodymium oxide, or a color pigment) that filters light emissions so that light passing through or reflected by the optical element exhibits a spectral notch, as disclosed in U.S. Patent Application Publication No. 2013/0170199 A2 entitled "LED lighting using spectral notching" (which is hereby incorporated by reference herein). Such publication discloses that CRI and GAI values of LED light sources can be improved through use of notch filtering, such as to increase CRI from 84 to 90, and to increase GAI from 50 to 58. Alternatively, careful selection of materials used in LED lighting devices may permit attainment of CRI Ra values of 90 to 95 or more—see, e.g., U.S. Pat. No. 7,213,940, which is hereby incorporated by reference.

The art continues to seek improved solid state lighting devices providing desirable illumination characteristics, as well as improved methods for making solid state devices.

SUMMARY

The present disclosure relates in various aspects to solid state (e.g., LED) lighting devices including one or more notch filtering materials arranged to filter light emissions to exhibit a spectral notch. In certain aspects, one or more notch filtering materials may be arranged in at least one coating. In certain aspects, one or more notch filtering materials may be arranged in at least one coating deposited directly on a solid state emitter chip or directly on a lumiphoric material that itself is coated or otherwise deposited on a solid state emitter chip. In certain aspects, emissions of a notch filtered solid state lighting device may include a CRI Ra value of at least 80 and a GAI value in a range of from 75 to 100, or more preferably in a range of from 80 to 100. In certain aspects, methods of fabricating lighting devices include providing at least one coating material layer with a notch filtering material. Methods of illuminating an object, a space, or an environment, utilizing a solid state lighting device as disclosed herein are further provided.

In one aspect, the present disclosure relates to a solid state lighting device comprising: at least one electrically activated solid state emitter chip; a lumiphoric material arranged in a lumiphoric material coating deposited on the at least one electrically activated solid state emitter chip to receive at least a portion of emissions of the at least one electrically activated solid state emitter chip and responsively emit lumiphor emissions; and a notch filtering material arranged in a filter coating or layer deposited on the lumiphoric material coating, wherein the notch filtering material is arranged to receive at least a portion of the lumiphor emissions and filter the received lumiphor emissions to exhibit a spectral notch.

In another aspect, the present disclosure relates to a solid state lighting device comprising: at least one electrically activated solid state emitter chip; and a coating deposited on the at least one electrically activated solid state emitter chip, the coating including a lumiphoric material blended with a notch filtering material; wherein: the lumiphoric material is arranged to receive at least a portion of emissions of the at least one electrically activated solid state emitter chip and responsively emit lumiphor emissions; and the notch filtering material is arranged to receive at least a portion of the lumiphor emissions and filter the received lumiphor emissions to exhibit a spectral notch.

In another aspect, the present disclosure relates to at least one electrically activated solid state emitter; a lumiphoric material arranged to receive at least a portion of emissions of the at least one electrically activated solid state emitter and responsively emit lumiphor emissions; and a notch filtering material arranged to receive at least a portion of the lumiphor emissions and filter the received lumiphor emissions to exhibit a spectral notch; wherein emissions of the solid state lighting device have (i) a color rendering index (CRI) value of at least 80, and (ii) a gamut area index (GAI) value in a range of from 80 to 100.

In yet another aspect, the present disclosure relates to a method for fabricating a solid state lighting device, the method comprising: mounting, on a substrate or submount, at least one electrically activated solid state emitter comprising a spray coating including a notch filtering material arranged to receive at least a portion of emissions of the at least one electrically activated solid state emitter and filter the received emissions to exhibit a spectral notch; and establishing at least one electrical connection between the at least one electrically activated solid estate emitter and at least one conductor or conductive region associated with the substrate or submount.

In still another aspect, the present disclosure relates to a method for fabricating a solid state lighting device, the method comprising: fabricating a plurality of electrically activated solid state emitters on an emitter substrate; coating the plurality of electrically activated solid state emitters with at least one coating material layer comprising a notch filtering material; and separating the plurality of electrically activated solid state light emitters into a plurality of discrete coated electrically activated solid state light emitters.

In another aspect, the present disclosure relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 1 is a side cross-sectional view of a first conventional light emitting diode package.

FIG. 2 is an excerpt of a CIE 1931 chromaticity diagram showing the blackbody locus and including a line of minimum tint (or "white body line") extending between CCT values from 2700K to 6500K.

FIG. 3 is a two dimensional plot of gamut area index (GAI) and color rendering index (CRI Ra) including a shaded region at upper right representing a preferred combination of CRI Ra≥80 and 80≤GAI≤100.

FIG. 4A is a chart including CCT, CRI Ra, GAI, CIE 1931 (x,y) coordinates, luminous efficacy (lm/W), and scotopic/photopic (S/P) ratios for eighteen different light sources.

FIG. 4B is an excerpt of a CIE 1931 chromaticity diagram showing the blackbody locus, the line of minimum tint (or "white body line") extending between CCT values from 2700K to 6500K, and (x,y) coordinate plots for selected sources of the eighteen light sources listed in FIG. 4A.

FIG. 5A is a side cross-sectional view of at least a portion of a first LED chip wafer portion prior to coating of one or more layers of functional materials thereon.

FIG. 5B is a side cross-sectional view of the LED chip wafer portion of FIG. 5A following coating with a first layer of functional material.

FIG. 5C is a side cross-sectional view of the LED chip wafer portion of FIG. 5B following coating with a second layer of functional material.

FIG. 5D is a side cross-sectional view of the LED chip wafer portion of FIG. 5C following top side thinning of the coatings applied thereon to expose electrical contact regions.

FIG. 5E is a side cross-sectional view of multiple coated LED chips following division of the LED chip wafer portion of FIG. 5D.

FIG. 6A is a side cross-sectional view of at least a portion of a second LED chip wafer portion following coating or covering of at least one layer of functional material thereon.

FIG. 6B is a side cross-sectional view of at the LED chip wafer portion of FIG. 6A following selective regional top side thinning of the at least one layer of functional material to expose electrical contact regions.

FIG. 6C is a side cross-sectional view of multiple coated LED chips following division of the LED chip wafer portion of FIG. 6B.

FIG. 7A is a top plan schematic view of at least a portion of a solid state emitter package including two solid state emitter chips arranged in a reflector cavity according to one embodiment.

FIG. 7B is a side cross-sectional schematic view of the at least a portion of a solid state emitter package according to FIG. 7A.

FIG. 7C is a side cross-sectional schematic view of at least a portion of a solid state emitter package similar to FIG. 7A with addition of at least one filtering material arranged over an encapsulant contained within the reflector cavity and covering the emitter chips.

FIG. 7D is a side cross-sectional schematic view of at least a portion of a solid state emitter package similar to FIG. 7A, with addition of a wavelength conversion material covering at least one emitter chip, an encapsulant material covering the wavelength conversion material within the reflector cavity, and least one filtering material arranged over the wavelength conversion material and at least partially contained within the reflector cavity.

FIG. 7E is a side cross-sectional schematic view of at least a portion of a solid state emitter package similar to FIG. 7A, with addition of at least one filtering material covering at least one emitter chip and reflective surfaces of the reflector cavity.

FIG. 7F is a side cross-sectional schematic view of at least a portion of a solid state emitter package similar to FIG. 7A, with addition of a wavelength conversion material covering at least one emitter chip, and a filtering material covering the wavelength conversion material and reflective surfaces of the reflector cavity.

FIG. 8A is a side cross-sectional schematic view of at least a portion of a solid state light emitting device including a solid state emitter chip arranged over a package mount, with a top surface of the emitter chip being covered with a wavelength conversion material and a filtering material.

FIG. 8B is a side cross-sectional schematic view of at least a portion of a solid state light emitting device including the device of FIG. 8A with addition of a curved (e.g., hemispherical) lens.

FIG. 8C is a side cross-sectional schematic view of at least a portion of a solid state light emitting device including a solid state emitter chip arranged over a package mount, with top and side surfaces of the emitter chip and an upper surface of the package mount being covered with a wavelength conversion material and a filtering material.

FIG. 8D is a side cross-sectional schematic view of at least a portion of a solid state light emitting device including the device of FIG. 8C with addition of a lens having a substantially rectangular cross-sectional shape.

FIG. 8E is a side cross-sectional schematic view of at least a portion of a solid state light emitting device including a solid state emitter chip arranged over a package mount, with a top surface of the emitter chip being covered with a wavelength conversion material and a filtering material, and with side surfaces of the emitter chip and an upper surface of the package mount being covered with a filtering material.

FIG. 8F is a side cross-sectional schematic view of at least a portion of a solid state light emitting device including the device of FIG. 8E with addition of a lens having a beveled upper edge with a non-rectangular (polygonal) cross-sectional shape.

FIG. 9 is a side cross-sectional view of at least a portion of a solid state lighting emitting device including multiple solid state emitter chips coated with multiple functional materials and arranged under a hemispherical optical element.

FIG. 10 is a perspective view of at least a portion of a solid state emitter package including multiple solid state emitter chips coated with one or more functional materials, with the chips coupled to electrical traces via wirebonds and arranged under a hemispherical optical element.

FIG. 11 is a side cross-sectional view of a first light bulb arranged to incorporate multiple solid state emitter chips as disclosed herein.

FIG. 12 is a side cross-sectional view of a second, reflector-type light bulb arranged to incorporate at least one emitter chip as disclosed herein.

FIG. 13 is a side cross-sectional view of a third light bulb arranged to incorporate multiple solid state emitter chips as disclosed herein in a tower-type configuration.

FIG. 14A is an upper perspective view of a troffer-type light fixture arranged to incorporate multiple solid state emitter chips as disclosed herein.

FIG. 14B is a side cross-sectional view of a portion of the light fixture of FIG. 14A.

FIG. 15 is a plot of radiant flux versus wavelength for a spectral output of a solid state light emitting device with superimposed notch filtered spectral output.

FIG. 16 depicts spectral transmittance versus wavelength for an illustrative color pigment material.

FIG. 19 illustrates gamut area and color point for each of the four light sources characterized in FIG. 17, superimposed with an excerpt of the 1931 CIE chromaticity diagram including the blackbody locus and the line of minimum tint (white body line).

FIG. 20 illustrates spectral output (relative intensity) versus wavelength for the four light sources characterized in FIG. 17, showing the effect of increased neodymium filter concentration on spectral output.

FIG. 21A is a bar chart representing CRI values including results for 14 color chips and the composite CRI Ra value for the second (i.e., unfiltered solid state) light source characterized in FIG. 17.

FIG. 21B is a bar chart representing CRI values including results for 14 color chips and the composite CRI Ra value for the fourth (i.e., Neo WBL neodymium filtered) solid state light source characterized in FIG. 17.

DETAILED DESCRIPTION

Figures 17, 18:
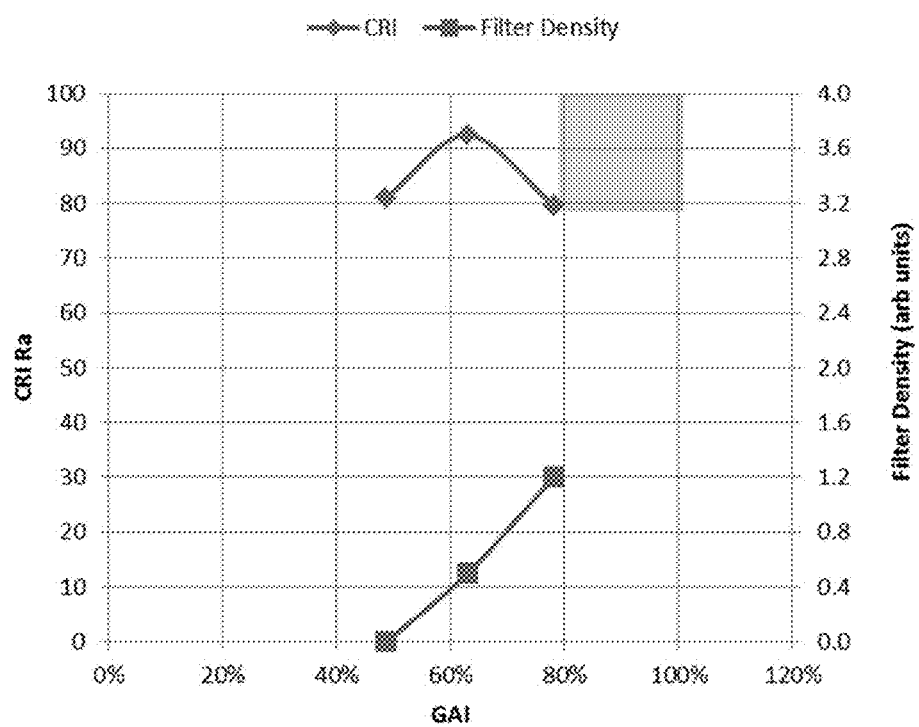
FIG. 17 is a table providing GAI, CRI Ra, R9 rendering, LEP luminous efficacy (optical), S/P ratio, lumens per watt, filter lumen loss percentage, Du'v' (distance from BBL in 1976 CIE color space), and neodymium filter density values for four light sources.
FIG. 18 is a GAI as a function of filter density, with an overlaid plot of CRI Ra, for the three solid state light sources summarized in FIG. 17.

As noted previously, the art continues to seek solid state lighting devices providing desirable illumination characteristics, as well as improved methods for making solid state devices. Various embodiments disclosed herein include solid state light emitters with one or more notch filtering materials arranged to filter light emissions to exhibit a spectral notch. In certain embodiments, one or more notch filtering materials may be arranged in at least one coating. In certain embodiments, such coating(s) may be deposited directly on a solid state emitter chip or directly on a lumiphoric material that itself is coated or otherwise deposited on a solid state emitter chip. At least one notch filtering material may be provided at sufficient concentration and amount to significantly enhance gamut of a light emitting device. In certain embodiments, notch filtering material is provided in sufficient amount to exceed the threshold required for attaining maximum CRI Ra and actually to cause CRI Ra to decline relative to a maximum value thereof, in order to yield enhanced gamut area. In certain embodiments, emissions of a notch filtered solid state lighting device may include a CRI Ra value of at least 80 and a GAI value in a range of from 75 to 100, or more preferably in a range of from 80 to 100. Methods of fabricating light emitting devices that include at least one coating material layer with a notch filtering material are further provided.

Unless otherwise defined, terms used herein should be construed to have the same meaning as commonly understood by one of ordinary skill in the art to which the present disclosure belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Embodiments of the present disclosure are described herein with reference to cross-sectional, perspective, elevation, and/or plan view illustrations that are schematic illustrations of idealized embodiments of the present disclosure. Variations from the shapes of the illustrations as a result, for example, of manufacturing techniques and/or tolerances, are to be expected, such that embodiments of the present disclosure should not be construed as limited to particular shapes illustrated herein. The present disclosure may be embodied in different forms and should not be construed as limited to the specific embodiments set forth herein. In the drawings, the size and relative sizes of layers and regions may be exaggerated for clarity. In certain drawings, conventional features inherent to LED devices known in the art but not essential to the understanding of the present disclosure have been omitted to facilitate ease of explanation of the inventive subject matter.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" may be used herein to describe a relationship between one structure or portion to another structure or portion as illustrated in the figures, but it should be understood that such relative terms are intended to encompass different orientations of the device in addition to the orientation depicted in the figures. For example, if the device in the figures is turned over, structure or portion described as "above" other structures or portions would now be oriented "below" the other structures or portions.

The terms "solid state light emitter" or "solid state emitter" (which may be qualified as being "electrically activated") may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the present disclosure may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may optionally be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Although certain embodiments shown in the figures may be appropriate for use with vertical LEDs, it is to be appreciated that the present disclosure is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity. Examples of vertical and horizontal LED chip structures are discussed by way of example in U.S. Publication No. 2008/0258130 to Bergmann et al. and in U.S. Pat. No. 7,791,061 to Edmond et al. which are hereby incorporated by reference herein.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength, or of at least one desired perceived color (including combinations of colors that may be perceived as white). Lumiphoric materials may be provided in the form of particles, films, or sheets.

Inclusion of lumiphoric (also called 'luminescent') materials in lighting devices as described herein may be accomplished by any suitable means, including: direct coating on solid state emitters, dispersal in encapsulant materials arranged to cover solid state emitters; coating on lumiphor support elements (e.g., by powder coating, inkjet printing, or the like); incorporation into diffusers or lenses; and the like. Examples of lumiphoric materials are disclosed, for example, in U.S. Pat. No. 6,600,175, U.S. Patent Application Publication No. 2009/0184616, and U.S. Patent Application Publication No. 2012/0306355, and methods for coating light emitting elements with phosphors are disclosed in U.S. Patent Application Publication No. 2008/0179611, with the foregoing publications being incorporated by reference. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

In certain embodiments, at least one lumiphoric material may be spatially segregated ("remote") from and arranged to receive emissions from at least one electrically activated solid state emitter, with such spatial separation reducing thermal coupling between a solid state emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more emitters electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness and/or concentration may vary relative to multiple electrically activated emitters. In certain embodiment, at least one lumiphoric material may be applied to a solid state emitter or a lumiphoric material support surface by patterning, such may be aided by one or more masks.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages. In certain embodiments, at least a portion of a substrate may include a dielectric material to provide desired electrical isolation between electrical traces or components of multiple LED sets. In certain embodiments, a substrate can comprise ceramic such as alumina, aluminum nitride, silicon carbide, or a polymeric material such as polyimide, polyester, etc. In certain embodiments, a substrate can comprise a flexible circuit board or a circuit board with plastically deformable portions to allow the substrate to take a non-planar (e.g., bent) or curved shape allowing for directional light emission with LED chips of one or more LED components also being arranged in a non-planar manner.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a light emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light emitting apparatus including multiple LEDs may include at least one of the following items arranged to receive light from multiple LEDs: multiple lenses; multiple optical elements; and multiple reflectors. Examples of optical elements include, but are not limited to elements arranged to affect light mixing, focusing, collimation, dispersion, and/or beam shaping.

In certain embodiments, a package including multiple solid state emitters may include multiple die attach pads, with a single die attach pad supporting each separately controllable solid state emitter or each separately controllable group of solid state emitters. A package including multiple solid state emitters may include a single lens (e.g., a molded lens) arranged to transmit at least a portion of light emanating from each solid state emitter. In certain embodiments, a molded lens may be arranged in direct contact with LED chips, die attach pads, other electrical elements, and/or exposed insulating material along a top surface of a substrate comprising insulating material. In certain embodiments, a lens may be textured or faceted to improve light extraction, and/or a lens may contain or have coated thereon various materials such as lumiphors and/or scattering particles.

In certain embodiments, a package may include a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate to which or over which with multiple LED chips are mounted.

In certain embodiments, a solid state lighting device (e.g., package) may include a reflector cup defining a cavity, at least one solid state emitter arranged within the cavity, and encapsulant material arranged within the cavity. In certain embodiments, at least one solid state emitter may be arranged over a substrate and at least partially surrounded by a boundary wall (optionally embodying at least one dispensed dam material laterally spaced from the emitter(s), with an encapsulant material arranged over the emitter(s) and in contact with the at least one boundary wall.

Various devices disclosed herein may include multiple solid state emitters (e.g., LEDs) of the same or different dominant colors, or of the same or different peak wavelengths. In certain embodiments, a solid state light emitting and/or display device may include at least three colors such as red, green, and blue emitters, which may include solid state light emitters devoid of phosphors, or may include phosphors (e.g., in combination with UV and/or blue emitters) to generate one or more of the red, green, and blue colors. Other combinations of colors may be used. In certain embodiments, a solid state light emitting and/or display device may include at least two colors such as red and green, which may include solid state light emitters devoid of phosphors, or may include phosphors to generate one or more of the colors. Other combinations of output colors may be provided.

The expressions "lighting device" and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. In certain embodiments, lighting devices or light emitting apparatuses as disclosed herein may be self-ballasted. In certain embodiments, a light emitting apparatus may be embodied in a light fixture.

In preferred embodiments, a solid state lighting device is devoid of any incandescent light emitting element.

The inventive subject matter further relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array).

The term "notch filtering material" refers to a material that affects passage of light to cause light exiting the material to exhibit a spectral notch. A spectral notch is a portion of the color spectrum where the light is attenuated, thus forming a "notch" when light intensity is plotted against wavelength. Examples of notch filtering materials include rare earth and lanthanide materials, such as lanthanum, cerium, praseodymium, neodymium, promethium, samarium, europium, gadolinium, terbium, dysprosium, holmium, erbium, thulium, ytterbium, lutetium, scandium, and yttrium, as well as oxides thereof (e.g., neodymium oxide). Different rare earth compounds may exhibit notch filtering characteristics of different wavelength ranges. For example, neodymium (or oxide thereof) when used as a filtering material may produce a spectral notch in the yellow range, whereas erbium (or oxide thereof) when used as a filtering material may produce a spectral notch in the cyan range. Additional notch filtering materials include color pigments. As with the use of rare earth compounds, the use of color pigments can impart notch filtering properties in either transmissive or reflective applications. In many instances, color pigments may provide softer spectral notch (with more gradually sloping wavelength attenuation) characteristics relative to other notch filtering materials. One example of a color pigment includes an ultramarine pigment based on $CoAl_2O_4$, providing peak attenuation at a wavelength of about 580 nm. A cobalt blue pigment of similar composition could also be used. Other color pigments based on $CuSO_4$ or $NiCl_2$ can also be used. A variety of both natural and synthetic pigments are available and could be used as notch filtering materials according to embodiments of the present disclosure. Notch filters may also be fabricated by depositing one or more dielectric layers (e.g., to form dielectric stacks) on substrates.

Different notch filtering materials may exhibit spectral notches at different wavelength ranges and with different notch shapes (e.g., whether narrower or wider in notch shape). For example, optical notch filters are available from Thorlabs, Inc. (Newton, N.J., US) having the following center wavelengths (CWL) and full width at half maximum (FWHM) characteristics: CWL=488 nm, FWHM=15 nm; CWL=514 nm, FWHM=17 nm; CWL=533 nm, FWHM=17 nm; CWL=561 nm, FWHM=18 nm; CWL=594 nm, FWHM=23 nm; 633 nm, FWHM=25 nm; and CWL=658 nm, FWHM=26 nm, with the foregoing notch filters each including a dielectric stack on a polished glass substrate.

In certain embodiments, a spectral notch provided by at least one filtering material as disclosed herein may have a full width in a range of less than or equal to 40 nm, or less than or equal to 35 nm, or less than or equal to 30 nm, or less than or equal to 25 nm, or less than or equal to 20 nm, in each case corresponding to a half maximum relative reduction in light transmission.

In certain embodiments, at least one filtering material may be arranged to filter light within (or overlapping) the yellow-green range or yellow range, such as to provide peak attenuation in a range of from 550 nm to 590 nm, or from 570 nm to 590 nm.

Applicant recognizes that the wafer-level and chip-level phosphor coating methods disclosed (for example) in U.S. Patent Application Publication No. 2008/0179611 (which is incorporated by reference) may be used to coat devices with layers including one or more notch filtering materials. In certain embodiments, electrically conducting pedestals/posts may be formed on one or more LED contacts (bond pads) while LEDs are at the wafer level, then coated with one or more functional materials (e.g., notch filtering materials), and the coating may be planarized, thinned, or otherwise selectively removed to expose top surfaces of pedestals (for subsequent establishment of electrical connections such as by wirebonding).

In certain embodiments, notch filtering materials may be provided as microparticles or nanoparticles of any desired size, size distribution, and geometric shape. In certain embodiments, multiple notch filtering materials may be mixed and incorporated in a carrier or binder, or multiple notch filtering materials may otherwise be used in combination (e.g., in sequential layers, with or without a binding medium) to provide multiple spectral notches. In certain embodiments, notch filtering materials may be arranged in or on an at least partially light-transmissive optical element or enclosure, which may serve as a lens and/or diffuser. Examples of desirable materials for carriers, binding media, enclosures, and/or optical elements include (but are not limited to) silicone, resin, epoxy, thermoplastic polycondensate, polymeric materials, and glass. In certain embodiments, such materials may be molded and/or cured together with at least one notch filtering material. In certain embodiments, a lighting device may include one or more transmissive optical elements and/or reflective optical elements incorporating at least one notch filtering material. For example, a so-called "troffer" style ceiling fixture may include a reflector that serves as an optical element, and may additionally include optical elements such as glass plates or lenses.

In certain embodiments, at least one filtering material (e.g., notch filtering material) may be arranged with a substantially constant thickness and/or concentration relative to different electrically activated emitters (e.g., solid state emitters such as LEDs). In certain embodiments, one or more filtering materials may be arranged on or over at least one solid state emitter (optionally with an intervening lumiphoric material) with presence, composition, thickness, and/or concentration that vary relative to different emitters. Multiple filtering materials (e.g., filtering materials of different compositions and arranged to provide spectral notches at different wavelengths) may be applied to one or more electrically activated emitters. In certain embodiments, at least one filtering material may be applied over one or more solid state light emitters, or over a support surface (e.g., lens, diffuser, reflector, etc.) utilizing a patterning technique, such may be aided by one or more masks. In certain embodiments, one or more notch filtering materials may be integrated with or arranged in contact with one or more portions of a solid state emitter package.

In certain embodiments, one or more notch filtering materials may be mixed with one or more other functional materials (e.g., lumiphoric materials, scattering materials, and the like) and preferably incorporated into a binder or other carrier medium. In certain embodiments, at least one filtering material may be arranged in or on a carrier arranged on or over a plurality of solid state light emitters.

In certain embodiments, notch filtering materials may be arranged in or on a reflector, which may be either specularly reflective or diffusively reflective. Any suitable reflective material in the art may be used, including (but not limited to) MCPET (foamed white polyethylene terephthalate), and surfaces metalized with one or more metals such as (but not limited to) silver (e.g., a silvered surface). MCPET manufactured by Otsuka Chemical Co. Ltd. (Osaka, Japan) is a diffuse white reflector that has a total reflectivity of 99% or more, a diffuse reflectivity of 96% or more, and a shape holding temperature of at least about 160° C. A preferred light-reflective material would be at least about 90% reflective, more preferably at least about 95% reflective, and still more preferably at least about 98-99% reflective of light of a desired wavelength range, such as one or more of visible light, ultraviolet light, and/or infrared light, or subsets thereof. In certain embodiments, at least one notch filtering material may be deposited on a surface of a reflector by spray coating, spin coating, sputtering, dipping, or rolling. Additionally deposition methods that may be used include electrostatic deposition and electrophoretic deposition. In certain embodiments, at least one notch filtering may be incorporated into a surface of a reflector via methods such as molding or sintering.

In certain embodiments, one or more notch filtering materials may be coated or otherwise arranged on, over, or against at least one surface of one or more one solid state emitter chips. In certain embodiments, one or more notch filtering materials may be coated or otherwise arranged on, over, or against at least one surface of at least one lumiphoric material, wherein the at least one lumiphoric material may be arranged in direct contact with at least one surface of a solid state emitter chip, or may be arranged remotely from (i.e., spatially segregated from) at least one surface of a solid state emitter chip. In certain embodiments, one or more notch filtering materials may be conformally coated on the surface of at least one solid state emitter chip and/or lumiphoric material, wherein conformal coating in this regard refers to a coating that follows the shape and contour of at least one surface (or preferably multiple surfaces) of a chip with a substantially uniform thickness.

As will be recognized by one skilled in the art, parameters such as the type or composition of carrier or binding medium; the thickness, concentration, particle size, and particle size distribution of notch filtering material(s); and the presence, amount, and type of other trace substances accompanying one or notch filtering elements, may be adjusted to provide one or more spectral notches of desired width and/or depth.

In certain embodiments, a solid state lighting device may include at least one lumiphoric material coated over at least one solid state emitter chip (e.g., a LED chip), and a notch filtering material may be coated over the at least one lumiphoric material. For example, a solid state lighting device may lumiphoric material arranged in a lumiphoric material coating deposited on at least one solid state emitter chip to receive at least a portion of emissions of the at least one solid state emitter chip and responsively emit lumiphor emissions (whereby emissions of the lighting device may include emissions of at least one solid state emitter chip and emissions of at least one lumiphoric material). A notch filtering material may be arranged in a filter coating or layer deposited on the lumiphoric material coating, wherein the notch filtering material is arranged to receive at least a portion of the lumiphor emissions and filter the received lumiphor emissions to exhibit a spectral notch. In certain embodiments, the lumiphoric material coating may include a first spray coating, and the filter coating or layer may include a second spray coating. In certain embodiments, a filter coating or layer may include an encapsulant material. In certain embodiments, at least one solid state emitter chip may be arranged within a cavity of a reflector cup (or a boundary wall), and at least a portion of encapsulant material (which may include a filtering material) may be arranged in contact with at least one boundary wall of the cavity. In certain embodiments, at least one boundary wall (e.g., a dispensed dam material) may be arranged on or over a substrate supporting one or more solid state emitters, with the boundary wall being laterally spaced from and arranged to surround at least a substantial portion of the solid emitter(s), and encapsulant material (which may include a filtering material) may be arranged in contact with the at least one boundary wall. In certain embodiments, emissions of the solid state lighting device may include at least a portion of emissions of the at least one solid state emitter and at least a portion of the lumiphor emissions. A notch filtering material may include at least one rare earth material, at least one color pigment, and/or at least one dielectric stack. A resulting notch filtered solid state lighting device according to certain embodiments may include emissions having a gamut area index (GAI) value in a range of from 80 to 100, and/or (but preferably in combination with) a color rendering index (CRI Ra) value of at least 75, or preferably at least 80, or in one of the following ranges: from 75 to 95, from 75 to 90, from 80 to 95, or from 80 to 90. A notch filtering material according to certain embodiments may be arranged to provide a spectral notch having a full width of less than 40 nm corresponding to a half maximum relative reduction in light transmission. In certain embodiments, the notch filtering material may serve to attenuate intensity of emissions output by the solid state lighting device by at least 10%, or at least 20%, or at least 30%, or at least 40%, or at least 50%. In certain embodiments, a light bulb or lighting fixture may include the foregoing lighting device(s). In certain embodiments, a method comprises illuminating an object, a space, or an environment, utilizing the foregoing lighting device(s).

In certain embodiments, at least one solid state emitter chip may be arranged on a submount (e.g., a package mount or other substrate). In certain embodiments, the submount may be devoid of lumiphoric material and notch filtering material arranged on the submount. In certain embodiments, at least a portion of the submount extending beyond a lateral extent of the solid state emitter chip may include notch filtering material arranged on or over such a portion of the submount. In certain embodiments, at least a portion of the submount extending beyond a lateral extent of the solid state emitter chip may include lumiphoric material and notch filtering material arranged on or over such a portion of the submount In certain embodiments, a solid state lighting device may include at least one coating, including lumiphoric material blended with a notch filtering material, over at least one solid state emitter chip (e.g., at least one LED chip), wherein the lumiphoric material is arranged to receive at least a portion of emissions of the at least one solid state emitter chip and responsively emit lumiphor emissions, and the notch filtering material is arranged to receive at least a portion of the lumiphor emissions and filter the received lumiphor emissions to exhibit a spectral notch. In certain embodiments, emissions of the lighting device may include emissions of at least one solid state emitter chip and emissions of at least one lumiphoric material. In certain embodiments, the coating may include a spray coating and/or a conformal coating. In certain embodiments, an encapsulant material may be arranged on or over the coating. In certain embodiments, at least one solid state emitter chip may be arranged within a cavity of a reflector cup, and at least a portion of encapsulant material may be arranged within the cavity (e.g., in contact with at least one boundary wall of the cavity). In certain embodiments, a cavity may be defined in at least one boundary wall (which may comprise a dispensed dam material) that may be arranged on or over a substrate supporting one or more solid state emitters, with the boundary wall being laterally spaced from and arranged to surround at least a substantial portion of the solid emitter(s), and encapsulant material may be arranged in contact with the at least one boundary wall. A notch filtering material may include at least one rare earth material, at least one color pigment, and/or at least one dielectric stack. A resulting notch filtered solid state lighting device according to certain embodiments may include emissions having a gamut area index (GAI) value in a range of from 80 to 100 and/or (but preferably in combination with) a color rendering index (CRI Ra) value of at least 75, or more preferably at least 80. A notch filtering material according to certain embodiments may be arranged to provide a spectral notch having a full width of less than 40 nm corresponding to a half maximum relative reduction in light transmission. In certain embodiments, the notch filtering material may serve to attenuate intensity of emissions output by the solid state lighting device by at least 10%, or at least 20%, or at least 30%, or at least 40%, or at least 50%. In certain embodiments, a light bulb or lighting fixture may include the foregoing lighting device(s). In certain embodiments, a method comprises illuminating an object, a space, or an environment, utilizing the foregoing lighting device(s).

In certain embodiments, a solid state light device may be fabricated with steps including coating at least one solid state light emitter with at least one notch filtering material, and mounting the pre-coated at least one solid state light emitter on a substrate or submount. For example, a method for fabricating a solid state lighting device may include mounting, on a substrate or submount, at least one electrically activated solid state emitter comprising a spray coating including a notch filtering material arranged to receive at least a portion of emissions of the at least one solid state emitter and filter the received emissions to exhibit a spectral notch, and thereafter establishing at least one electrical connection between the at least one solid estate emitter and at least one conductor or conductive region associated with the substrate or submount. In certain embodiments, a solid state emitter may comprise at least one electrically activated solid state emitter chip and a lumiphoric material arranged to receive at least a portion of emissions of the at least one electrically activated solid state emitter chip and responsively emit lumiphor emissions. In certain embodiments, at least one solid state emitter may be coated with a spray coating including a notch filtering material (optionally also including a lumiphoric material) prior to mounting of the at least one solid state emitter on the substrate or submount. In certain embodiments, at least one notch filtering material may be spray coated on or over the substrate or submount (e.g., before mounting of the at least one solid state emitter or thereafter). In certain embodiments, a substrate or submount may include or have associated therewith a reflector, and a notch filtering material may be spray coated on or over the reflector. In certain embodiments, the spray coating (e.g., including a notch filtering material, optionally in combination with lumiphoric material) may be covered with an encapsulant material. In certain embodiments, an optical element (e.g., a lens or diffuser) may be formed or attached over at least one solid state emitter (and optionally over at least one encapsulant material). In certain embodiments, the notch filtering material may comprise a rare earth element or a color pigment as disclosed herein.

In certain embodiments, one or more solid state lighting devices may be fabricated with steps including coating multiple solid state emitters with notch filtering material, and then separating the emitters into multiple discrete coated emitters. For example, a method for fabricating at least one solid state lighting device may include fabricating a plurality of electrically activated solid state emitters on an emitter substrate; coating the plurality of electrically activated solid state emitters with at least one coating material layer comprising a notch filtering material (optionally in combination with at least one lumiphoric material); and separating the plurality of electrically activated solid state light emitters into a plurality of discrete coated electrically activated solid state light emitters. In certain embodiments, the coating may include spray coating. In certain embodiments wherein at least one coating material layer comprises a lumiphoric material, the method may further include blending the notch filtering material and the lumiphoric material, wherein the at least one coating material comprises a single coating material. In certain embodiments, the plurality of solid state emitters may include multiple electrically activated solid state emitter chips and at least one lumiphoric material arranged to receive at least a portion of emissions of the multiple electrically activated solid state emitter chips and responsively emit lumiphor emissions. In certain embodiments, at least one coated electrically activated solid state light emitters may be mounted on a substrate or submount, at least one electrical connection may be established (e.g., via soldering, heating, brazing, or other means) between the at least one coated electrically activated solid state emitter and at least one conductor or conductive region associated with the substrate or submount. In certain embodiments, at least one optical element comprising lens or diffuser may be formed or otherwise attached over at least one pre-coated solid state emitter. In certain embodiments, the notch filtering material may comprise a rare earth element or a color pigment as disclosed herein.

In certain embodiments, a solid state lighting device may include at least one electrically activated solid state emitter, at least one lumiphoric material arranged to receive at least a portion of emissions of the at least one solid state emitter and responsively emit lumiphor emissions, and a notch filtering material arranged to receive emissions of the lighting device to exhibit a spectral notch, to provide emissions with a color rendering index (CRI Ra) value of preferably at least 75 (more preferably at least 80), together with a gamut area index (GAI) value in a range of from 80 to 100. In certain embodiments, at least one electrically activated solid state emitter may include a light emitting diode (LED) chip, and the notch filtering material may be arranged in contact with at least one surface of the at least one LED chip. In certain embodiments, at least one electrically activated solid state emitter may include a LED chip and a lumiphoric material arranged to receive at least a portion of emissions of the at least one LED chip and responsively emit lumiphor emissions, and the notch filtering material may be arranged in contact with at least one surface of the at least one LED chip. In certain embodiments, at least one solid state emitter chip may be arranged within a cavity of a reflector cup, the filtering material may be arranged in an encapsulant material, and at least a portion of encapsulant material may be arranged in contact with at least one boundary wall of the cavity. In certain embodiments, at least one boundary wall (e.g., a dispensed dam material) may be arranged on or over a substrate supporting one or more solid state emitters, with the boundary wall being laterally spaced from and arranged to surround at least a substantial portion of the solid emitter(s), and encapsulant material containing a filtering material may be arranged in contact with the at least one boundary wall. In certain embodiments, a notch filtering material may be embodied a coating arranged on at least one solid state emitter. A notch filtering material according to certain embodiments may include at least one rare earth material, at least one color pigment, and/or at least one dielectric stack. In preferred embodiments, the solid state lighting device is devoid of any incandescent light emitting element. In certain embodiments, a light bulb or lighting fixture may include the foregoing lighting device(s). In certain embodiments, a method comprises illuminating an object, a space, or an environment, utilizing the foregoing lighting device(s).

Various features and embodiments of the present disclosure are described with reference to the accompanying figures.

FIGS. 5A-5E illustrate various steps that may be used in producing solid state emitter chips 31 with wafer-level coating of at least one layer of functional material, including at least one notch filtering material.

FIG. 5A illustrates a LED chip wafer portion 30 with multiple LED chips 31 shown at a wafer level, following fabrication of LEDs chips on or over a substrate 32 but prior to separation/singulation into individual LED chips. A vertical phantom line is shown to show a separation or dicing line between the LED chips 31. Although only two LED chips 31 are shown, it is to be appreciated that any suitable number of chips may be formed on a single wafer.

Each LED chip 31 comprises a semiconductor LED that can have many different semiconductor layers arranged in different ways. The fabrication and operation of LEDs is generally known in the art and only briefly discussed herein. The layers of the LED 31 can be fabricated using known processes (e.g., using metal organic chemical vapor deposition). The layers of the LEDs 31 generally comprise an active layer/region 35 sandwiched between first and second oppositely doped epitaxial layers, e.g., n-type layer 36 and a p-type layer 34, which are formed on or otherwise arranged on a substrate 32. An intermediate mounting layer 33 may be used if the semiconductor layers 34-36 were grown on a different (e.g., sacrificial substrate), such as may be appropriate for flip-chip LEDs. Each LED 31 may include first and second contacts 37, 39 such as such as platinum or indium tin oxide. An upwardly extending pedestal 38 may be formed on a top side contact 37. A p-type contact 39 may be formed on the carrier substrate 32. A pedestal 38 (which may have a thickness in a range of from 20 to 200 μm, or more preferably 20 to 60 μm) can be formed of many different electrically conductive materials (e.g., gold) and can be formed using many different known physical or chemical deposition processes such as electroplating, mask deposition (e-beam, sputtering), electroless plating, or stud bumping. A pedestal 38 may optionally include a reflecting layer or reflective material to reduce optical losses.

FIG. 5B is a side cross-sectional view of the LED chip wafer portion of FIG. 5A following coating of the LEDs 31 with a first layer 41 of functional material according to any suitable coating method disclosed herein The first layer 41 may include, for example, a lumiphoric material and/or a notch filtering material, preferably arranged in a binder. The coating 41 extends over the entire top surface of each LED 31, including the pedestals 38.

FIG. 5C is a side cross-sectional view of the LED chip wafer portion of FIG. 5B following coating of the LEDs 31 and the first layer 41 with a second layer 42 of functional material. The second layer 42 may include a notch filtering material and optionally at least one other functional material, preferably arranged in a binder.

As shown in FIGS. 5B-5C, the functional materials 41, 42 may be conformally coated on the surface of the LED chips 31 to follow the shape and contour of multiple (e.g., top and side) surfaces of the chips 31 with a substantially uniform thickness.

FIG. 5D is a side cross-sectional view of the LED chip wafer portion of FIG. 5C following top side planarization or thinning of the coatings 41, 42 applied thereon to expose electrical contact regions at top surfaces of the pedestals 38. Many different thinning processes can be used including known mechanical processes such as grinding, lapping or polishing, preferably after the binder has cured. Other fabrication methods can comprise scraping with a squeegee (or similar element) to thin the coating before it is cured or pressure planarization before the coating is cured. In other embodiments the coating(s) can be thinned via etching or ablation. In certain embodiments, after planarization or thinning, one or more of the coatings 41, 42 may be textured such as by laser texturing, mechanical shaping, etching (chemical or plasma), scratching, or other processes, such as to enhance light extraction.

FIG. 5E is a side cross-sectional view of multiple coated LED chips 31 following division or singulation of the LED chip wafer portion of FIG. 5D. Any suitable singulation method may be used, such as dicing, scribing and breaking, or etching. The singulating process separates each of the LED chips 31 with each having substantially the same thickness of the functional layers 41, 42, and preferably substantially the same emission characteristics. Following singulation of the LED chips 31, layers of functional materials 41, 42, preferably remain on side surfaces of the LED, such as to affect LED light that is emitted from the side surfaces.

FIGS. 6A-6C illustrate various steps that may be used according to another embodiment for producing solid state emitter chips 51 with wafer-level coating or covering of at least one layer of functional material including at least one notch filtering material, wherein the at least one layer of functional material is only locally removed along a top surface thereof. A chip wafer portion 50 includes multiple LEDs 51 coated or otherwise covered with at least one layer 61 of functional material (e.g., notch filtering material, optionally accompanied with lumiphoric material). The layers of the LEDs 51 generally include an active layer/region 55 sandwiched between first and second oppositely doped epitaxial layers, e.g., n-type layer 56 and p-type layer 54, which are formed on or otherwise arranged on a substrate 52. An intermediate mounting layer 53 may be provided. Each LED 51 may include first and second contacts 57, 59. An upwardly extending pedestal 58 may be formed on a top side contact 57. A p-type contact 59 may be formed on the carrier substrate 52.

FIG. 6B shows the LED chip wafer portion 50 of FIG. 6A following selective regional top side thinning of the layer 61 to yield recessed regions (or holes) 63 that expose electrical contact regions along top surfaces of the pedestals 58. Rather than planarizing the layer 61, a top surface of the layer 61 remains at a level higher than the pedestals 58 and a portion of the layer 61 burying the pedestals 58 is removed leaving the recesses regions 63 in the layer 61. Many different methods can be used to selectively remove the layer 61 (which may embody a coating) to form the recessed regions 63, such as conventional patterning or etching processes. Referring to FIG. 6C, the LED chips 51 may be singulated thereafter using conventional methods.

FIGS. 7A-7B schematically illustrate at least a portion of a solid state light emitting device 100 including two solid state emitter chips 105A, 105B arranged over a submount or substrate 101 and within a cavity bounded laterally by walls 102. The walls 102 and portion of the substrate 101 may be coated, impregnated, or otherwise fabricated with a reflective material to form a reflector 103 arranged to reflect at least a portion of emissions of the emitter chips 105A, 105B toward a light output surface 109 of the device 100. An encapsulant material 106 is provided over the emitter chips 105A, 105B and substantially fills the cavity bounded by the walls 102 and the substrate 101. The emitter chips 105A, 105B may optionally include one or more lumiphoric materials. Although not shown in FIGS. 7A-7B, a lens of any desirable shape may be arranged over the encapsulant 106. A peripheral region 104 of the light emitting device 100, embodying a top surface of the walls 102 that are peripherally arranged around the reflector 103, may be fabricated of a light absorbing (e.g., dark) material in order to reduce reflection of ambient light impinging on the device 100. The light emitting device 100 may include at least one filtering material mixed with the encapsulant 106, preferably arranged to receive ambient light incident on the light emitting device 100 such that at least a portion of reflected ambient light exhibits at least one spectral notch. The emitter chips 105A, 105B may embody the same or different dominant wavelengths. In certain embodiments, the emitter chips may include dominant wavelengths that differ by at least 40 nm, at least 50 nm, or another desired threshold value.

FIG. 7C schematically illustrates at least a portion of another solid state light emitting device 110 including multiple emitter chips (e.g., including chip 115A as illustrated) similar to the device 100 of FIGS. 7A-7B, but with addition of at least one filtering material layer 118 arranged over an encapsulant or lens material 117 covering the emitter chips 115A and reflector 113, which is bounded by the substrate or submount 111, side walls 112, and peripheral region 114. The filtering material layer 118 may embody a light output surface 119 of the device 110. A peripheral region 114 embodying a top surface of the walls 112 that is peripherally arranged around the reflector 113 may be fabricated of a light absorbing material. The at least one filtering material layer 118 is arranged to receive emissions of the emitter chips such that at least a portion of the emitted light exhibits a spectral notch.

FIG. 7D schematically illustrates at least a portion of another solid state light emitting device 120 including multiple emitter chips (e.g., including chip 125A as illustrated) similar to the device 100 of FIGS. 7A-7B, but with addition of a wavelength conversion (e.g., lumiphoric) material 126A covering at least one emitter chip 125A, an encapsulant material 127 covering the wavelength conversion material 126A within a cavity bounded by the reflector 123, and least one filtering material 128 arranged over the wavelength conversion material 126A and at least partially contained within the reflector cavity. The reflector 123 is bounded by the substrate or submount 121, side walls 122, and peripheral region 124. A top surface of the filtering material layer 128 may embody a light output surface 129 of the device 120. The at least one filtering material 128 is arranged to receive emissions of the emitter chips and the wavelength conversion material 126A such that at least a portion of the emitted light exhibits a spectral notch.

FIG. 7E schematically illustrates at least a portion of another solid state light emitting device 130 including multiple emitter chips (e.g., including chip 135A as illustrated) similar to the device 100 of FIGS. 7A-7B, but with addition of at least one filtering material layer 138 covering at least one emitter chip 135A and covering reflective surfaces of the reflector cavity (e.g., to form a reflector 133). The reflector 133 is bounded by the substrate or submount 131, side walls 132, and peripheral region 134. Encapsulant and/or lens material 137 may be arranged in the cavity to cover the at least one filtering material layer 138. A top surface of the encapsulant and/or lens material 137 may embody a light output surface 139 of the device 130. The at least one filtering material 138 is arranged to receive emissions of the emitter chips such that at least a portion of the emitted light exhibits a spectral notch.

FIG. 7F schematically illustrates at least a portion of another solid state light emitting device 140 including multiple emitter chips (e.g., including chip 145A as illustrated) similar to the device 100 of FIGS. 7A-7B, but with addition of a wavelength conversion material 146A covering at least one emitter chip 145A, and a filtering material 148 covering the wavelength conversion material 146A and reflective surfaces of the reflector 143. The reflector 143 is bounded by the substrate or submount 141, side walls 142, and peripheral region 144. Encapsulant and/or lens material 147 may be arranged in the cavity to cover the at least one filtering material layer 148. A top surface of the encapsulant and/or lens material 147 may embody a light output surface 149 of the device 140. The at least one filtering material 148 is arranged to receive emissions of the emitter chips such that at least a portion of the emitted light exhibits a spectral notch.

FIGS. 8A-8F illustrate solid state light emitting devices including wavelength conversion material and notch filtering material in various configurations.

FIG. 8A illustrates a solid state light emitting device 200 including a solid state emitter (e.g., LED) chip 203 (which may include LED epitaxial layers and a support) arranged over a top surface 202 of a package mount (or other substrate) 201, with a top surface 204 of the emitter chip 203 being covered with a lumiphoric material 206 (e.g., in a first layer) and a filtering material 208 (e.g., in a second layer). The package mount 211 may include metalized regions and/or vias (not shown) for conduction of electrical signals to the emitter chip 203. Side surfaces 205 of the emitter chip 203 may be exposed or otherwise coated with one or more of lumiphoric material and notch filtering material. In certain embodiments, the LED chip 203 may be coated with a lumiphoric material 206 and a notch filtering material 208, and thereafter the pre-coated LED chip 203 may be mounted to the package mount 201 followed by establishment of suitable electrically conductive connection(s) to the LED chip 203. Coating may be performed according to any suitable process disclosed herein, such as spray coating.

FIG. 8B illustrates a solid state light emitting device 200A including the device 200 of FIG. 8A following addition of a lens 209 having a curved (e.g., substantially hemispherical) shape. Such lens 209 may be formed by any suitable method, including but not limited to molding using silicone material. In certain embodiments, the lens 209 may have a width or lateral extent that is substantially equal to a width or lateral extent of the package mount 201, and a peripheral portion 209A of the lens 209 may have a substantially uniform thickness.

FIG. 8C illustrates a solid state light emitting device 210 including a solid state emitter (e.g., LED) chip 213 (which may include LED epitaxial layers and a support) arranged over an upper surface 212 of a package mount (or other substrate) 211, with a top surface 214 and side surfaces 215 of the emitter chip 213, as well as the upper surface 212 of the package mount 211, being covered with a wavelength conversion material 216 (e.g., in a first layer) and a filtering material 218 (e.g., in a second layer). In certain embodiments, the LED chip 213 may be mounted to the package mount 211, and thereafter the LED chip 213 and upper surface 212 of the package mount 211 may be coated with a lumiphoric material 216 and a notch filtering material 218. Coating may be performed according to any suitable process disclosed herein, such as spray coating. Such materials 216, 218 may be arranged in conformal layers that follow the shape and outline of multiple surfaces of the emitter chip 213. Electrical connections to the LED chip 213 may be made either before or after coating steps.

FIG. 8D illustrates a solid state light emitting device 210A including the device 210 of FIG. 8A following addition of a lens 219 having a substantially rectangular cross-sectional curved (e.g., substantially hemispherical) shape. Such lens 219 may be formed by any suitable method, including but not limited to molding using silicone material. In certain embodiments, the lens 219 may have a width or lateral extent that is substantially equal to a width or lateral extent of the package mount 211.

FIG. 8E illustrates a solid state light emitting device 220 including a solid state emitter chip 223 arranged over a package mount 221, with a top surface 224 of the emitter chip 223 being covered with a wavelength conversion material 226 and a filtering material 228, and with side surfaces 225 of the emitter chip 223 and an upper surface 222 of the package mount 221 being covered with a filtering material 228. In certain embodiments, the LED chip 223 may be pre-coated with the wavelength conversion material 226, then mounted to the package mount 221, and thereafter the pre-coated LED chip 223 and upper surface 222 of the package mount 221 may be coated with a notch filtering material 228. Coating may be performed according to any suitable process disclosed herein, such as spray coating. The notch filtering material 228 may be arranged in a conformal layer that follows the shape and outline of multiple surfaces of the emitter chip 223. Electrical connections to the LED chip 223 may be made either before or after a notch filtering material coating step.

FIG. 8F illustrates a solid state light emitting device 220A including the device 220 of FIG. 8E with addition of a lens 229 having a beveled upper edge 229A with a non-rectangular (polygonal) cross-sectional shape. Such lens 229 may be formed by any suitable method, including but not limited to molding using silicone material. In certain embodiments, the lens 229 may have a width or lateral extent that is substantially equal to a width or lateral extent of the package mount 221.

Although different lens shapes are illustrated in combination with different coated LED and/or coated package mount structures in FIGS. 8B, 8D, and 8F, it is to be appreciated that lenses according to the shapes shown in any of FIGS. 8B, 8D, and 8F may be applied to any of the devices 200, 210, and 220 according to FIGS. 8A, 8C, and 8E.

While not illustrated in FIGS. 8A-8F, one or more boundary walls, dams, or dam portions may be deposited (e.g., dispensed) or otherwise provided on the package mount(s) 201, 211, 221 and laterally spaced relative to the emitter chips 203, 213, 223 to contain one or more layers of material subject to being deposited over the emitter chips 203, 213, 223. In certain embodiments, an emitter chip may be mounted to a package mount 201, 211, 221, and then one or more layers of functional material (e.g., lumiphoric material and/or notch filtering material) may be deposited to fill portions or an entirety of a volume contained between the boundary wall/dam and the package mount to cover the emitter chips 203, 213, 223. In certain embodiments, following mounting of an emitter chip to a package mount and formation of at least one dam or boundary wall, substantially an entire volume contained by the dam or boundary wall may be filled with a lumiphor-containing material, and optionally planarized and cured, followed by coating or deposition of one or more layers of notch filtering material over the previously-filled volume.

FIG. 9 is a side cross-sectional view of at least a portion of a solid state light emitting device 250 including multiple solid state emitter (e.g., LED) chips 255 arranged over a submount 251 in flip-chip configuration, with both anode and cathode connections on the bottom of the chips 255. The emitter chips 255 may (optionally) include angled or beveled upper edges with a non-rectangular (e.g., polygonal) cross-section, with such shape serving to enhance light extraction. The emitter chips 255 may be coated with multiple functional materials (e.g., including at least one notch filtering material) in conformal layers 256, 258 and arranged under a hemispherical optical element (e.g., lens) 260, with the conformal layers 256, 258 following the shape and contour of multiple surfaces of the emitter chips 255 (preferably with substantially constant thickness). Such coating may be performed using any coating technique disclosed herein or otherwise known in the art. As shown in FIG. 9, each conformal layer 256, 258 may extend over, between and laterally beyond the chips 255 (such as over a reflective material disposed between or adjacent to the emitter chips 255). The optical element 260 may be separated from the emitter chips 255 via a gap or an intervening material 259, which may include encapsulant or a fluid medium such as liquid or gel (e.g., mineral oil, perfluorinated polyether (PFPE) liquid, or other fluorinated or halogenated liquid or gel). Such material 259 may also include an index matching medium characterized by a refractive index that provides for reduced or minimal reflection or internal refraction of light emissions. In certain embodiments, elements 259, 260 may embody a single element, such as molded silicone. In certain embodiments, a thickness of each conformal layer may be less than half the spacing between adjacent emitter chips 255. In certain embodiments, spacing between emitter chips 255 may be on the order of 10 to 75 micrometers, although larger spacing (up to 150 or even 500 micrometers) may also be used. In certain embodiments, the optical element 260 may include one or more functional materials, such as lumiphoric material, notch filtering material, and/or scattering material, which may be doped, coated, or otherwise provided in or on the optical element 260. Still referring to FIG. 9, the submount 251 (e.g., alumina, aluminum nitride, high temperature polymers, etc.) is covered with a pattern of metal (e.g., traces) 253 that may be used to interconnect the emitter chips 255 and provide connection to a power supply. The metal pattern 253 includes connection pads 252 with insulating material 254 therebetween. In operation of the device 250, upon passage of light through one or more notch filtering materials (e.g., associated with layers 256, 258 and/or the optical element 260), the light will exhibit a spectral notch, and the notch filtering may be specifically tailored to increase GAI (optionally in combination with enhanced CRI Ra).

FIG. 10 illustrates a solid state emitter package 300 including multiple solid state emitter (e.g., LED) chips 305 coated (e.g., precoated during chip manufacture, or after mounting of chips) with one or more functional materials (e.g., lumiphoric material and notch filtering material), and coupled to electrical traces or metal patterns 302 via wirebonds 316 and arranged under a hemispherical optical element (e.g., lens) 310. As shown, twelve emitter chips 305 are provided in contact with metal traces 302 arranged over submount 301, and cathodes of the LED chips are connected by wirebonds 316 to traces 302. In certain embodiments, the optical element 310 may include one or more functional materials, such as lumiphoric material, notch filtering material, and/or scattering material, which may be doped, coated, or otherwise provided in or on the optical element 310. The emitter chips 305 may be selected from various light color bins to provide a combined light output with appropriate color characteristics for a desired application. The unfiltered efficiency of such a light emitting device 300 device with a warm white color may be on the order of 100 lm/W, prior to any filtering from the optical element; however, if the device 300 is binned for a cool white color, then an efficiency on the order of about 150 lm/W can be achieved, again prior to filtering.

FIG. 11 illustrates a first light bulb 400 arranged to incorporate multiple solid state emitter chips 402 as disclosed herein, with the light bulb 400 arranged to output notch filtered light. The solid state light bulb 400 includes a conventional power supply 404, and includes a heatsink 405 including fins to promote cooling of the emitter chips 402 and power supply 404. A lateral contact 410 and foot contact 411 may be compatible with an Edison-style screw-type light socket for conducting power to the light bulb 400. An optical element 408 (which may be embodied in a light-transmissive globe) is provided to protect the emitter chips 402 and provide light shaping and/or diffusion utility for light emissions of the bulb 400. The optical element 408 may optionally contain an intervening material (as described in connection with element 259 in FIG. 9). One or more lumiphoric materials may be associated with the emitter chips 402 and/or the optical element 408 to provide wavelength conversion utility. Additionally, one or more filtering materials (e.g., notch filtering materials) may be associated with the emitter chips and/or the optical element 408 to filter light emissions in order to exhibit at least one spectral notch as described herein. In certain embodiments, one or more emitter chips 402 may be coated with lumiphoric material and notch filtering material, whether in discrete layers or combined in a single coating layer. In operation of the bulb 400, upon passage of light through one or more notch filtering materials (e.g., associated with LEDs and/or the optical element 408), the light will exhibit a spectral notch, and the notch filtering may be specifically tailored to increase GAI (optionally in combination with enhanced CRI Ra).

FIG. 12 illustrates a second, reflector-type (i.e. PAR-style) light bulb 500 arranged to incorporate at least one emitter chip as disclosed herein and arranged to output notch filtered light. The light bulb 500 includes a reflector 504 and an optical element (e.g., lens) 506 covering a front or light emitting portion of the bulb 500, with the reflector 504 and lens 506 together forming a light-transmissive optical enclosure. An opposing end of the bulb includes contacts 510, 511 (e.g., an Edison-style threaded lateral contact 510 and a foot contact 511) for receiving power from a socket or other receptacle. The bulb 600 includes LED devices or dies (not visible) as previously discussed, with such components optionally including one or more notch filtering material layers and/or one or more lumiphoric materials. Additionally, one or more filtering materials (e.g., notch filtering materials) may be associated with the optical element 506 to filter light emissions in order to exhibit at least one spectral notch as described herein. In certain embodiments, at least one notch filtering material may be associated with (e.g., coated on or over) one or more emitter chips, and at least one notch filtering material may be additionally associated with the optical element 506. The optical element 506 may further include light scattering and/or lumiphoric materials in certain embodiments. In operation of the bulb 500, upon passage of light through one or more notch filtering materials (e.g., associated with LEDs and/or the optical element 506), the light will exhibit a spectral notch, and the notch filtering may be specifically tailored to increase GAI (optionally in combination with enhanced CRI Ra).

FIG. 13 illustrates a third light bulb arranged to incorporate multiple solid state emitter (e.g., LED) chips 627 as disclosed herein disposed in an array 628 in a tower-type configuration, such as disclosed in U.S. Patent Application Publication No. 2013/0271991 (incorporated by reference herein). The bulb 600 may embody an A-series bulb with an Edison base 602 including a lateral contact 603 and a foot contact 604. The base 602 may include a base printed circuit board 680 and electronics 610 within a housing 605, suitable for powering the bulb 600 and including a power supply and/or driver.

The bulb 600 includes multiple LED chips 627 (optionally pre-coated with at least one functional material, such as a lumiphoric material and/or a notch filtering material as disclosed herein) mounted on an upwardly-extending substantially tubular or tube-like submount (e.g., printed circuit board) 629 bounding an internal cavity 674. The LED chips 627 are operable to emit light when energized. The cavity 674 is capped by a heat conducting portion 652 that and engaging member 668 that fits with an engagement portion 666 associated with locking member 672 extending upward from an electrical interconnect 650 internal to the cavity 674. A globe-like enclosure (which may embody an optical element) 612 surrounds an interior volume containing a LED assembly 630 including the multiple emitter chips 627. A heatsink 654 is arranged between the enclosure 612 and the base 605, with a lock member 609 arranged to receive and retain deformable fingers 601 during assembly of the bulb 600. A bottom edge of the enclosure 612 abuts a top surface 654A of the heatsink 654. Internal conductors 664B are arranged to conduct electrical signals between the base PCB 680 and components of the LED assembly 630.

In certain embodiments, at least one notch filtering material may be associated with (e.g., pre-coated on during chip manufacture, or coated after mounting) one or more emitter chips 627, and at least one notch filtering material may be additionally associated with the enclosure (or optical element) 612. The optical element 612 may further include light scattering and/or lumiphoric materials in certain embodiments. In operation of the bulb 600, upon passage of light through one or more notch filtering materials (e.g., associated with LEDs 627 and/or the optical element 612), the light will exhibit a spectral notch, and the notch filtering may be specifically tailored to increase GAI (optionally in combination with enhanced CRI Ra).

FIGS. 14A-14B illustrate a troffer-type (in-ceiling linear) light fixture 700 arranged to incorporate multiple solid state emitter (e.g., LED) chips 726 as disclosed herein. Such chips 726 may optionally be pre-coated with one or more lumiphoric materials and/or notch filtering materials. Additionally, or alternatively, the fixture 700 may include one or more notch filtering materials applied to or included in a linear reflector to cause the light emitted from the light fixture to exhibit a spectral notch. Light fixture 700 includes pan 701, heatsink 702, reflector 708, and end caps 710, 711. End cap 710 is larger than end cap 711 and is shaped to act as a circuit box to house electronics used to drive and control the light source (e.g., rectifiers, regulators, timing circuitry, etc.). Although a reflector may take various shapes, in the illustrated embodiment, the reflector 708 includes a flat region opposite the heatsink 702. In alternative embodiments, the reflector 708 could be parabolic in shape, or include two or more parabolic regions. Light fixture 700 also includes a diffuser lens assembly including lens plates 715, 716, disposed adjacent to sides of the heatsink 702. Reflector 708 can be made of many different materials, including metal, polymeric material, microcellular polyethylene-terephthalate (MCPET), or other suitable materials. In certain embodiments, the reflector 708 may be coated, impregnated, doped, or otherwise provided with a filtering material layer 718 that introduces notch-filtering when light is reflected by the reflector. The filtering material layer 718 in some embodiments may also embody one or more films designed to filter light by introducing optical interference into the light path, or to cause the reflector to behave as a Bragg mirror. The notch filtering reflective surface is disposed opposite mounting surface 724 of heatsink 702, on which emitter chips 726 are mounted in a linear array, either directly or on a circuit board which is in turn mounted on the heatsink 702. In alternative embodiments, a light fixture may incorporate notch filtering materials in or on the lens plates 715, 716, whether instead of or in addition to notch-filtering material that may be associated with the reflector and/or the emitter chips 726 as mentioned above. In operation of the fixture 700, emissions may interact with one or more notch filtering materials associated with (e.g., pre-coated on) the LED chips 726, associated with the reflector 708, and/or associated with the lens plates 715, 716 such that the light will exhibit a spectral notch, and the notch filtering may be specifically tailored to increase GAI (optionally in combination with enhanced CRI Ra).

FIG. 15 is a graph 900 plotting radiant flux versus wavelength for a spectral output of a solid state light emitting device with superimposed notch filtered spectral output Curve 902 is a plot of measurements taken of the light output of an LED lamp constructed of a high-voltage multichip LED component in a mineral-oil filled, plain glass enclosure. Curve 904 is a plot of measurements taken of the light output of an LED lamp that is the same in most respects, except that the enclosure for the lamp measured for curve 904 is neodymium oxide doped glass. A notch is clearly visible between 550 nm and 650 nm wherein radiant flux is reduced due to filtering by the neodymium oxide notch filtering material. Measurement 906 represents the width of the notch corresponding to the comparative reduction in light intensity at half the maximum reduction caused by the notch, otherwise known from the field of signal processing as the full width at half the maximum (FWHM). Relative to the peak radiant flux of approximately 4.3 mW/nm, the notch filtered region includes a radiant flux trough of between 1.5-2 mW/nm. The difference between the two curves 902, 904 represents attenuation or reduction of light intensity. The notch shown in FIG. 15 is characteristic of neodymium oxide filtering material by including a relatively sharply sloping ("hard") shape profile and is more of a true "notch," as opposed to a filtered shape with a more gently sloping or "soft" notch that may be more characteristic of filtering materials such as color pigments.

FIG. 16 provides a line chart 1100 illustrating spectral transmittance versus wavelength for an illustrative color pigment material arranged to provide a spectral notch 1102 centered at about 580 nm. Transmittance of the color pigment material is nearly 100% at or below wavelengths of about 430 nm, and at or above wavelengths of about 730 nm. Between 430 nm and 730 nm, transmittance is reduced (to a minimum of about 50% at a wavelength of about 580 nm). As shown in FIG. 16, a color pigment may provide a softer spectral notch (with more gradually sloping wavelength attenuation) characteristics relative to other notch filtering materials such as rare earth metals and their oxides (e.g., as shown in FIG. 15).

To demonstrate results of adding different amounts of notch filtering material to notch filtering device, FIG. 17 provides modeling results including GAI, CRI Ra, R9 rendering, LEP luminous efficacy (optical), S/P ratio, lumens per watt, filter lumen loss percentage, Du'v' (distance from BBL in 1976 CIE color space), and neodymium filter density values for four light sources—namely, an incandescent source (second column), an unfiltered blue shifted (yellow plus red) or "BS(Y+R)" phosphor-converted LED source (third column), a high CRI lightly neodymium oxide filtered BS(Y+R) phosphor-converted LED source (fourth column), and a near-white body line, more heavily neodymium oxide filtered BS(Y+R) phosphor-converted LED (or "Neo WBL Nd filtered BS(Y+R)") source (fifth column). Each BS(Y+R) source included a 457 nm dominant wavelength blue LED (1% total lumen output of the device) arranged to stimulate emissions of two phosphors—namely, a cerium-doped yttrium aluminum garnet (Ce:YAG) or "YAG" 108 yellow phosphor having a dominant wavelength of 570 nm (69.2% total lumen output of the device) and a $CaAlSiN_3$ ('CASN') based red phosphor having a dominant wavelength of 600 nm (29.8% total lumen output of the device).

Comparing the incandescent and unfiltered BS(Y+R) solid state sources, both have GAI values of 49%, while the incandescent source has better CRI Ra (100 versus 81), the incandescent source has a higher S/P ratio, and the solid state source has greater luminous efficacy. Both sources are on the blackbody locus with Du'v' values of zero.

Comparing the unfiltered BS(Y+R) and high CRI neodymium filtered BS(Y+R) solid state sources, the filtered source has higher GAI (63% versus 49%), improved CRI Ra (92 versus 81), improved R9, and higher S/P ratio, but lower luminous efficacy due to filter lumen loss (19%) and is slightly removed from the blackbody locus with a Du'v' value of 0.006. The filtered "high CRI" solid state source (which has a neodymium oxide density of 0.5 relative to a 3.2 mm reference neodymium oxide filter) therefore provides enhanced CRI Ra and enhanced GAI relative to the unfiltered solid state source.

Comparing the high CRI Nd filtered BS(Y+R) and Neo WBL Nd filtered BS(Y+R) solid state sources, the latter (Neo WBL) source has more than twice the neodymium oxide density (i.e., 1.20 versus 0.5 relative to a 3.2 mm reference neodymium oxide filter), which results in even greater GAI (78% versus 63%) and greater S/P ratio (135 versus 1.25), but reduced CRI Ra (80 versus 92). Indeed, the Neo WBL Nd filtered BS(Y+R) source has a CRI Ra that is reduced even relative to the unfiltered solid state source (i.e., 80 versus 81). The Neo WBL Nd filtered BS(Y+R) further exhibits reduced luminous efficacy (70 LPW versus 86 LPW for the more lightly filtered source), as expected due to the increased filter lumen loss (34% versus 19%). The higher filtering material concentration also causes the color point to depart further from the blackbody locus (with a Du'v' value of 0014, or more than double the Du'v' value for the more lightly filtered source). The Neo WBL filtered solid source provides enhanced GAI while sacrificing CRI Ra and efficacy. Use of notch filtering material at a sufficiently high concentration to cause CRI Ra to actually decline and depart from the blackbody locus, while reducing luminous efficacy, runs counter to the conventional desire in the art to provide increased CRI Ra without undue loss of luminous efficacy and without departing from the blackbody locus.

FIG. 18 is a GAI as a function of filter density, with an overlaid plot of CRI Ra, for the three solid state light sources summarized in FIG. 17. The respective plots show that GAI values continue to increase with increasing filter density, and that CRI initially increases with increasing filter density but then decreases as filter density continues to increase beyond an inflection point. The shaded area at upper right represents a preferred combination of combination of CRI Ra≥80 and 80≤GAI≤100, which is almost but not quite attained by the Neo WBL Nd filtered BS(Y+R) source.

FIG. 19 illustrates gamut area and color point for each of the four light sources characterized in FIG. 17, superimposed with an excerpt of the 1931 CIE chromaticity diagram including the blackbody locus and the line of minimum tint (white body line). The incandescent source A and the unfiltered solid state source B both have the same color point on the blackbody locus and similar gamut areas (resulting in the same GAI value). The high CRI Nd filtered BS(Y+R) solid state source C has a color point that is intermediately arranged between the blackbody locus and the white body line, while having a larger gamut area than each of the incandescent source A and the unfiltered solid state source B. The Neo WBL Nd filtered BS(Y+R) solid state source D has a color point that is on the white body line (line of minimum tint), while having an even larger gamut area than the preceding sources.

FIG. 20 illustrates spectral output (relative intensity) versus wavelength for the four light sources characterized in FIG. 17, showing the effect of increased neodymium filter concentration on spectral output. The incandescent source A has a substantially linear relationship between spectral output and wavelength. The unfiltered solid state source B exhibits a first peak at 450 nm, a first trough centered at about 480 nm, and a broad composite peak centered at about 610 nm without a spectral notch. The high CRI Nd filtered BS(Y+R) solid state source C exhibits a significant spectral notch between about 560 nm-590 nm. The Neo WBL Nd filtered BS(Y+R) solid state source D exhibits an even deeper spectral notch between about 560 nm-590 nm, due to increased filter material concentration.

FIG. 21A is a bar chart representing CRI values including results for 14 color chips and the composite CRI Ra value for the second (i.e., unfiltered solid state) light source characterized in FIG. 17. FIG. 21B is a bar chart representing CRI values including results for 14 color chips and the composite CRI Ra value for the fourth (i.e., Neo WBL neodymium filtered) solid state light source characterized in FIG. 17. In each chart, the composite CRI Ra value is depicted at position 16. A comparison between FIGS. 21A and 21B shows that increasing neodymium oxide filter concentration can reduce CRI but increased perceived vividness of color, as shown by the increased R9 color rendering value (with R9 representing a red color that is difficult to render accurately). Such result is consistent with the increase GAI value provided by the increased neodymium oxide (notch) filter concentration.

It is further noted that the effect of the notch filter is, at least in part, produced by the width of the notch integrated with its depth. A very narrow notch needs to be deep (produce strong attenuation at its center wavelength) to achieve a similar effect to a wider notch with a shallower depth. A notch with a center wavelength closer to red will have less effect on total output of the bulb or fixture. Also, the center wavelength of the notch filter can be complementary to the amount of blue excitation from the LED(s) for enhanced CRI and GAI in a blue LED-based light emitting system.

Embodiments as disclosed herein may provide one or more of the following beneficial technical effects: enhancing perceived quality of emissions of lighting devices; enhancing vividness of colors represented by lighting devices; enhancing flexibility in production of filtered light emitting devices and elements; and reduction in usage of notch filtering materials (with concomitantly reduced cost) to achieve comparable light adjusting effects.

Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A solid state lighting device comprising:
   at least one electrically activated solid state emitter chip; and
   a coating deposited on the at least one electrically activated solid state emitter chip, the coating including a lumiphoric material blended with a notch filtering material;
   wherein:
   the lumiphoric material is arranged to receive at least a portion of emissions of the at least one electrically activated solid state emitter chip and responsively emit lumiphor emissions; and
   the notch filtering material is arranged to receive at least a portion of the lumiphor emissions and filter the received lumiphor emissions to exhibit a spectral notch.

2. The solid state lighting device according to claim 1, wherein the coating comprises a spray coating.

3. The solid state lighting device according to claim 1, wherein the coating comprises a conformal coating.

4. The solid state lighting device according to claim 1, further comprising an encapsulant material arranged on or over the coating.

5. The solid state lighting device according to claim 1, wherein the notch filtering material comprises at least one of lanthanum, cerium, praseodymium, neodymium, promethium, samarium, europium, gadolinium, terbium, dysprosium, holmium, erbium, thulium, ytterbium, lutetium, scandium, or yttrium.

6. The solid state lighting device according to claim 1, wherein the notch filtering material comprises a color pigment.

7. The solid state lighting device according to claim 1, wherein emissions of the solid state lighting device comprise at least one of the following features (i) or (ii): (i) a gamut area index (GAI) value in a range of from 80 to 100, or (ii) a color rendering index (CRI) value of at least 80.

8. A solid state lighting device comprising:
    at least one electrically activated solid state emitter chip mounted over a substrate or submount;
    a lumiphoric material arranged in a lumiphoric material coating comprising lumiphoric material particles deposited directly on the at least one electrically activated solid state emitter chip to receive at least a portion of emissions of the at least one electrically activated solid state emitter chip and responsively emit lumiphor emissions; and
    a notch filtering material arranged in a filter coating or layer deposited directly on the lumiphoric material coating, wherein the notch filtering material is arranged to receive at least a portion of the lumiphor emissions and filter the received lumiphor emissions to exhibit a spectral notch;
    wherein each of the lumiphoric material coating and the filter coating or layer is devoid of contact with the substrate or submount.

9. The solid state lighting device according to claim 8, wherein:
    the lumiphoric material coating comprises a first spray coating layer; and
    the filter coating or layer comprises a second spray coating layer.

10. The solid state lighting device according to claim 8, wherein the filter coating or layer comprises an encapsulant material.

11. The solid state lighting device according to claim 8, wherein the notch filtering material comprises at least one of lanthanum, cerium, praseodymium, neodymium, promethium, samarium, europium, gadolinium, terbium, dysprosium, holmium, erbium, thulium, ytterbium, lutetium, scandium, or yttrium.

12. The solid state lighting device according to claim 8, wherein the notch filtering material comprises at least one color pigment.

13. The solid state lighting device according to claim 8, wherein emissions of the solid state lighting device comprise at least one of the following features (i) or (ii): (i) a gamut area index (GAI) value in a range of from 80 to 100, or (ii) a color rendering index (CRI) value of at least 80.

14. A light bulb or light fixture comprising the solid state lighting device of claim 8.

15. The solid state lighting device according to claim 8, wherein:
    the lumiphoric material coating comprises a conformal lumiphoric material coating with a substantially uniform thickness over at least one surface of the at least one electrically activated solid state emitter chip; and
    the filter coating or layer comprises a conformal filter coating or layer with a substantially uniform thickness over the conformal lumiphoric material coating.

16. A solid state lighting device comprising:
    at least one electrically activated solid state emitter;
    a lumiphoric material arranged to receive at least a portion of emissions of the at least one electrically activated solid state emitter and responsively emit lumiphor emissions; and
    a notch filtering material arranged to receive at least a portion of the lumiphor emissions and filter the received lumiphor emissions to exhibit a spectral notch;
    wherein emissions of the solid state lighting device have (i) a color rendering index (CRI Ra) value of at least 80, and (ii) a gamut area index (GAI) value in a range of from 80 to 100.

17. The solid state lighting device according to claim 16, wherein the at least one electrically activated solid state emitter comprises at least one light emitting diode (LED) chip, and the notch filtering material is arranged in contact with at least one surface of the at least one LED chip.

18. The solid state lighting device according to claim 16, wherein:
    the at least one electrically activated solid state emitter comprises at least one light emitting diode (LED) chip; and
    the notch filtering material is arranged in contact with at least one surface of the lumiphoric material.

19. The solid state lighting device according to claim 16, further comprising a reflector cup or boundary wall defining a cavity, wherein the at least one electrically activated solid state emitter is arranged within the cavity, the notch filtering material is arranged within an encapsulant material, and at least a portion of the encapsulant material is within the cavity.

20. The solid state lighting device according to claim 16, wherein the notch filtering material is embodied in a coating arranged on the at least one electrically activated solid state emitter.

21. A method for fabricating at least one solid state lighting device according to claim 16, the method comprising:
    fabricating a plurality of electrically activated solid state emitters on an emitter substrate;
    coating the plurality of electrically activated solid state emitters with at least one coating material layer, wherein the at least one coating material layer comprises a lumiphoric material and comprises a notch filtering material; and
    separating the plurality of electrically activated solid state emitters into a plurality of discrete coated electrically activated solid state light emitters.

22. The method according to claim 21, wherein said coating comprises spray coating.

23. The method according to claim 21, further comprising:
    mounting, on a substrate or submount, at least one coated electrically activated solid state light emitter of the plurality of discrete coated electrically activated solid state light emitters; and
    establishing at least one electrical connection between the at least one coated electrically activated solid state light emitter and at least one conductor or conductive region associated with the substrate or submount.

* * * * *